United States Patent
Ozawa et al.

(10) Patent No.: US 9,788,463 B2
(45) Date of Patent: Oct. 10, 2017

(54) SEMICONDUCTOR MEMORY DEVICE HAVING A HEAT INSULATING MECHANISM

(71) Applicant: Toshiba Memory Corporation, Tokyo (JP)

(72) Inventors: Yasuyuki Ozawa, Tama Tokyo (JP); Fuminori Kimura, Yokohama Kanagawa (JP); Masaaki Niijima, Machida Tokyo (JP); Masahiro Iijima, Fuchu Tokyo (JP); Yoshiharu Matsuda, Kawasaki Kanagawa (JP); Kenichi Sawanaka, Yokohama Kanagawa (JP); Kazuhiro Yoshida, Yokohama Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 180 days.

(21) Appl. No.: 14/842,313

(22) Filed: Sep. 1, 2015

(65) Prior Publication Data

US 2016/0270266 A1     Sep. 15, 2016

(30) Foreign Application Priority Data

Mar. 13, 2015   (JP) ................................. 2015-051151

(51) Int. Cl.
   *H05K 7/20*     (2006.01)

(52) U.S. Cl.
   CPC ................................ *H05K 7/20754* (2013.01)

(58) Field of Classification Search
   CPC ........ H05K 7/20; H05K 7/20754; H05K 5/00; H05K 5/02; H05K 5/04; H05K 7/00; H01L 23/36; H01L 23/467; G06F 1/20; G06F 1/203; G06F 1/206
   USPC .......... 174/50, 17 VA, 17 R, 520, 559, 16.3, 174/16.1; 361/600, 601, 679.01, 679.02, 361/679.31, 679.33, 679.39, 679.46, 361/679.47, 649.48, 688; 312/223.1, 312/223.2, 223.6
   See application file for complete search history.

(56) References Cited

U.S. PATENT DOCUMENTS

| | | | | |
|---|---|---|---|---|
| 6,628,518 B2 * | 9/2003 | Behl | ................... | G11B 33/022 312/223.1 |
| 7,173,817 B2 * | 2/2007 | Wei | ................... | H05K 7/20736 361/679.48 |
| 7,177,147 B2 * | 2/2007 | Su | ......................... | G06F 1/184 361/679.46 |
| 8,045,328 B1 * | 10/2011 | Chen | ................. | H05K 7/20727 361/679.48 |

(Continued)

FOREIGN PATENT DOCUMENTS

JP     2002-217341 A     8/2002

*Primary Examiner* — Angel R Estrada
(74) *Attorney, Agent, or Firm* — Patterson & Sheridan, LLP

(57) ABSTRACT

A semiconductor memory device includes a semiconductor memory unit, a memory controller, a cover unit having a first portion covering the semiconductor memory unit and a second portion covering the memory controller, a first heat conduction member disposed between the semiconductor memory unit and the first portion of the cover unit, and a second heat conduction member disposed between the memory controller and the second portion of the cover. The cover unit has a gap formed between the first and second portions.

20 Claims, 10 Drawing Sheets

(56) References Cited

U.S. PATENT DOCUMENTS 8,289,692 B2 * 10/2012 Franz .................. G06F 1/183
                                                    361/679.33
8,472,183 B1 * 6/2013 Ross .................. H05K 7/1492
                                                    361/679.48

* cited by examiner

SEMICONDUCTOR MEMORY DEVICE HAVING A HEAT INSULATING MECHANISM

CROSS-REFERENCE TO RELATED APPLICATION

This application is based upon and claims the benefit of priority from Japanese Patent Application No. 2015-051151, filed Mar. 13, 2015, the entire contents of which are incorporated herein by reference.

FIELD

Embodiments described herein relate generally to a semiconductor memory device, in particular, a semiconductor memory device having a heat insulating mechanism.

BACKGROUND

Typically, an electronic device, e.g., a semiconductor memory device, has a substrate on which a plurality of electronic components is provided. Operation of the device causes the electronic components to generate heat. The electronic components may be cooled, for example, by being thermally connected to a heat sink or a housing of the device. When amount of heat generated by the electronic components is different, heat may be transferred from one electronic component to another electronic component.

DETAILED DESCRIPTION

An embodiment provides a server and a semiconductor memory device that may suppress heat transfer from one electronic component to another electronic component.

In general, according to an embodiment, a semiconductor memory device includes a semiconductor memory unit, a memory controller, a cover unit having a first portion covering the semiconductor memory unit and a second portion covering the memory controller, a first heat conduction member disposed between the semiconductor memory unit and the first portion of the cover unit, and a second heat conduction member disposed between the memory controller and the second portion of the cover unit. The cover unit has a gap formed between the first and second portions.

Hereinafter, a first embodiment will be described with reference to FIGS. 1 to 7. In the present disclosure, basically, a user side is defined as the front, a side far from a user is defined as the rear, a left side viewed from a user is defined as left, a right side viewed from a user is defined as right, an upper side viewed from a user is defined as top, and a lower side viewed from a user is defined as bottom. Regarding components relating to embodiments or descriptions of the components, various expressions may be used. Regarding the components and the descriptions, other expressions may be made. In addition, regarding the components and the descriptions that are not described in plural expressions, other expressions may be made.

Figure 1:
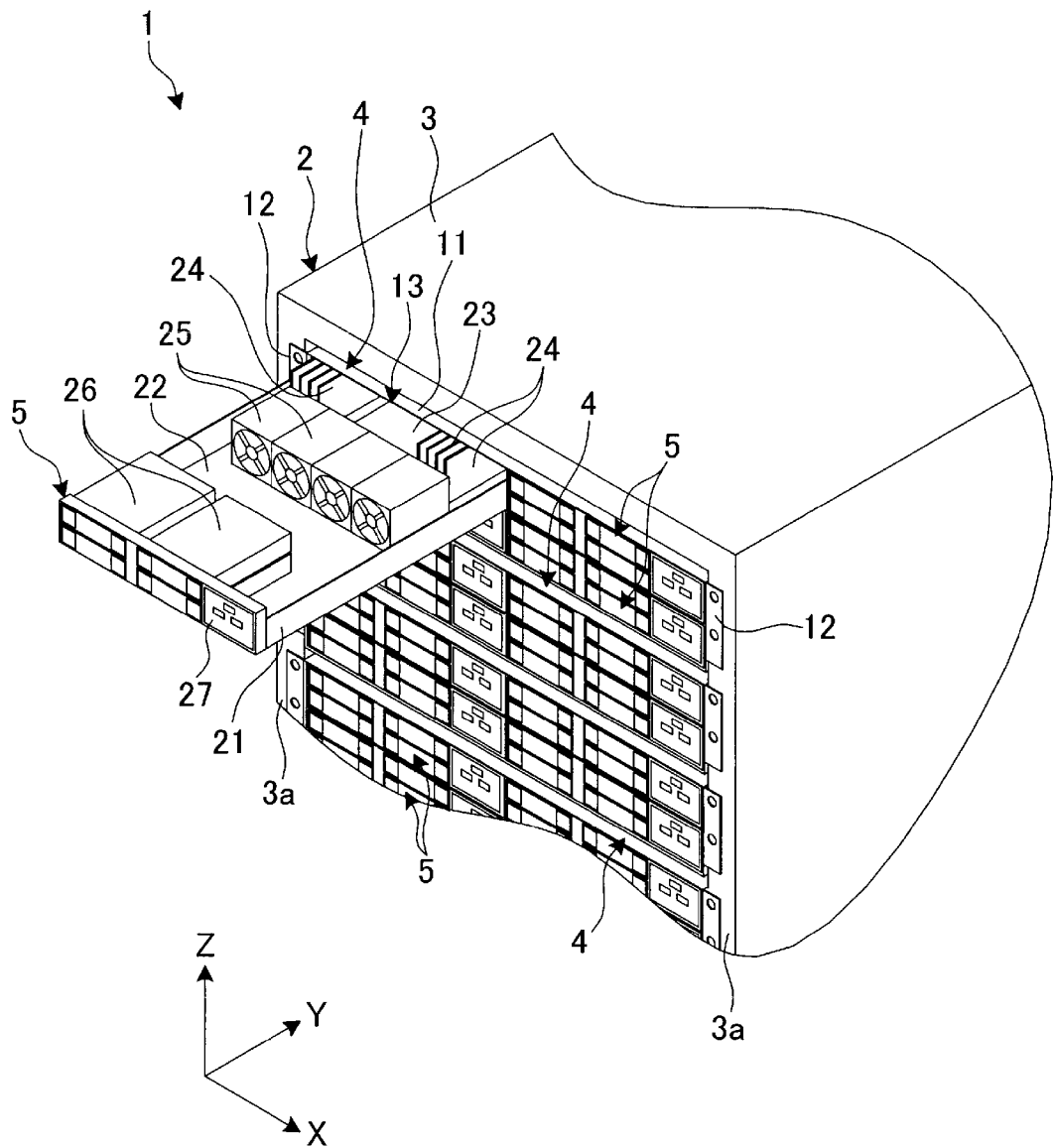
FIG. 1 is a perspective view of a portion of a data center according to a first embodiment.

FIG. 1 is a perspective view of a portion of a data center 1 according to the first embodiment. The data center 1 is an example of the server system, and may be also referred to as a storage system or a storage device, for example. The data center 1 includes a plurality of server farms 2, various devices such as a router and a switching hub, and various components such as a cable for connecting devices. FIG. 1 illustrates one server farm 2.

As illustrated in the drawings, in the present disclosure, an X axis, a Y axis, and a Z axis are defined. The X axis, the Y axis, and the Z axis are orthogonal to each other. The X axis extends along the width of the server farm 2. The Y axis extends along the depth of the server farm 2. The Z axis extends along the height direction of the server farm 2.

The server farm 2 includes a rack 3, a plurality of module enclosures 4, and a plurality of server modules 5. One of the server modules 5 is accommodated in each of the plurality of module enclosures 4. The module enclosure 4 which accommodates one of the server modules 5 configures a rack-mounted server. A server of the data center 1 is not limited thereto, and may be other types of servers such as a blade server.

The rack 3 includes two struts 3a which extend along the Z axis. A plurality of screw holes is provided in the strut 3a so as to be arranged to be aligned along the Z axis. The two struts 3a are arranged at a distance in a direction along the X axis. The module enclosure 4 may be inserted between the struts 3a.

The module enclosure 4 includes an enclosure case 11 and an attachment member 12. The module enclosure 4 may further include a power supply unit which is accommodated in the enclosure case 11. For example, four module slots 13 are provided in the enclosure case 11.

The attachment member 12 extends from a front end portion of the enclosure case 11 toward the outside of the enclosure case 11 in the direction along the X axis. A hole corresponding to the screw hole of the strut 3a is provided in the attachment member 12. The attachment member 12 is fixed to the strut 3a of the rack 3 using a bolt, for example. Thus, the module enclosure 4 is attached to the rack 3.

The server module 5 may be inserted into the module slot 13 of the enclosure case 11. If the server module 5 is inserted into the module slot 13, the server module 5 is able to receive electric power from the power supply unit of the module enclosure 4, for example. The server module 5 may receive electric power from other devices.

The server module 5 includes, for example, a module case 21, a module board 22, a central processing unit (CPU) 23, a plurality of memories 24, a plurality of fans 25, and a plurality of solid state drives (SSDs) 26. The module case 21 is an example of a first housing, and may be also referred to as or a wall, for example. The module board 22 is an example of the first board, and may be also referred to as a wiring board or a circuit board, for example. The fan 25 is an example of an air blowing unit, and may be also referred to as a cooling device, for example. The SSD 26 is an example of a memory device, and may be also referred to as an SSD device, a storage, an electronic device, a storage device, or a storage component, for example. The memory device is not limited to the SSD 26, and may be other devices such as a hybrid hard disk drive (hybrid HDD).

The module case 21 has a substantially rectangular box shape which has a space opened upward, and is extends in a direction along the Y axis. The shape of the module case 21 is not limited thereto, and may have a box shape which has a closed space, for example. The module case 21 accommodates the module board 22, the CPU 23, the memory 24, the fan 25, the SSD 26, and other components.

The module case 21 includes a front panel 27. The front panel 27 is a wall which is provided at a front end portion of the module case 21. Various connectors such as a USB connector are provided on the front panel 27.

The module board 22 is a printed wiring board, for example. The module board 22 may be other types of boards. The CPU 23, the memory 24, the fan 25, the SSD 26, and other components are directly provided on the module board 22, or on the module board 22 with other components therebetween.

The fan 25 is arranged in a region between a region where the CPU 23 and the memory 24 are positioned and a region where SSD 26 is positioned, in the direction along the Y axis. The fan 25 operates so as to enable an air flow to be generated in the module case 21 in the direction along the Y axis. Thus, the fan 25 may cool the CPU 23, the memory 24, the SSD 26, and other components. The air flow generated by the fan 25 may flow in other directions.

The SSD 26 is accommodated in, for example, a drive cage which is attached to the front panel 27. However, it is not limited to the SSD 26, and other storage devices such as a hard disk drive (HDD), which are used with the SSD 26 may be accommodated in the drive cage.

Figure 2:
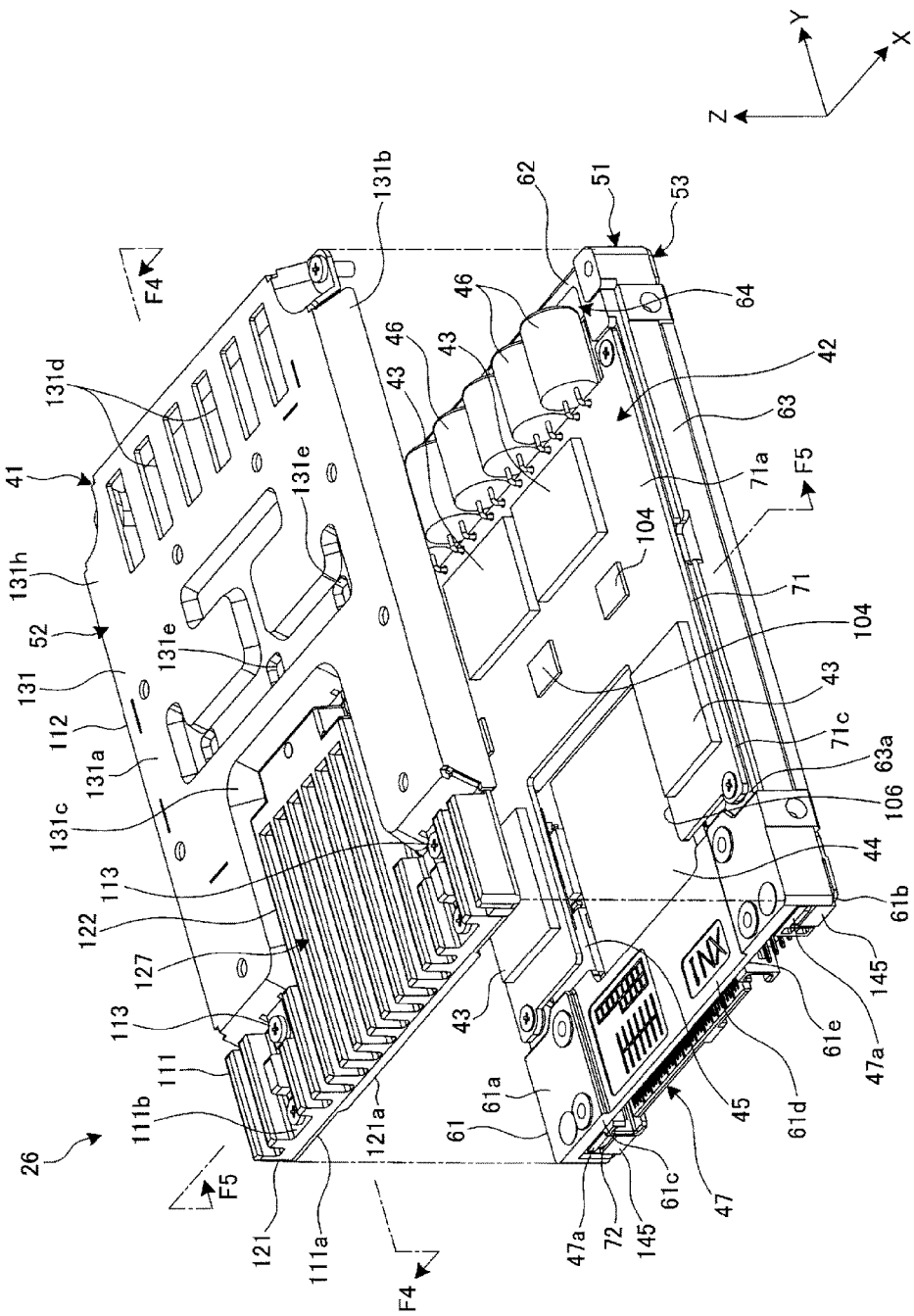
FIG. 2 is an exploded perspective view of an SSD included in the data center according to the first embodiment.
Figure 3:
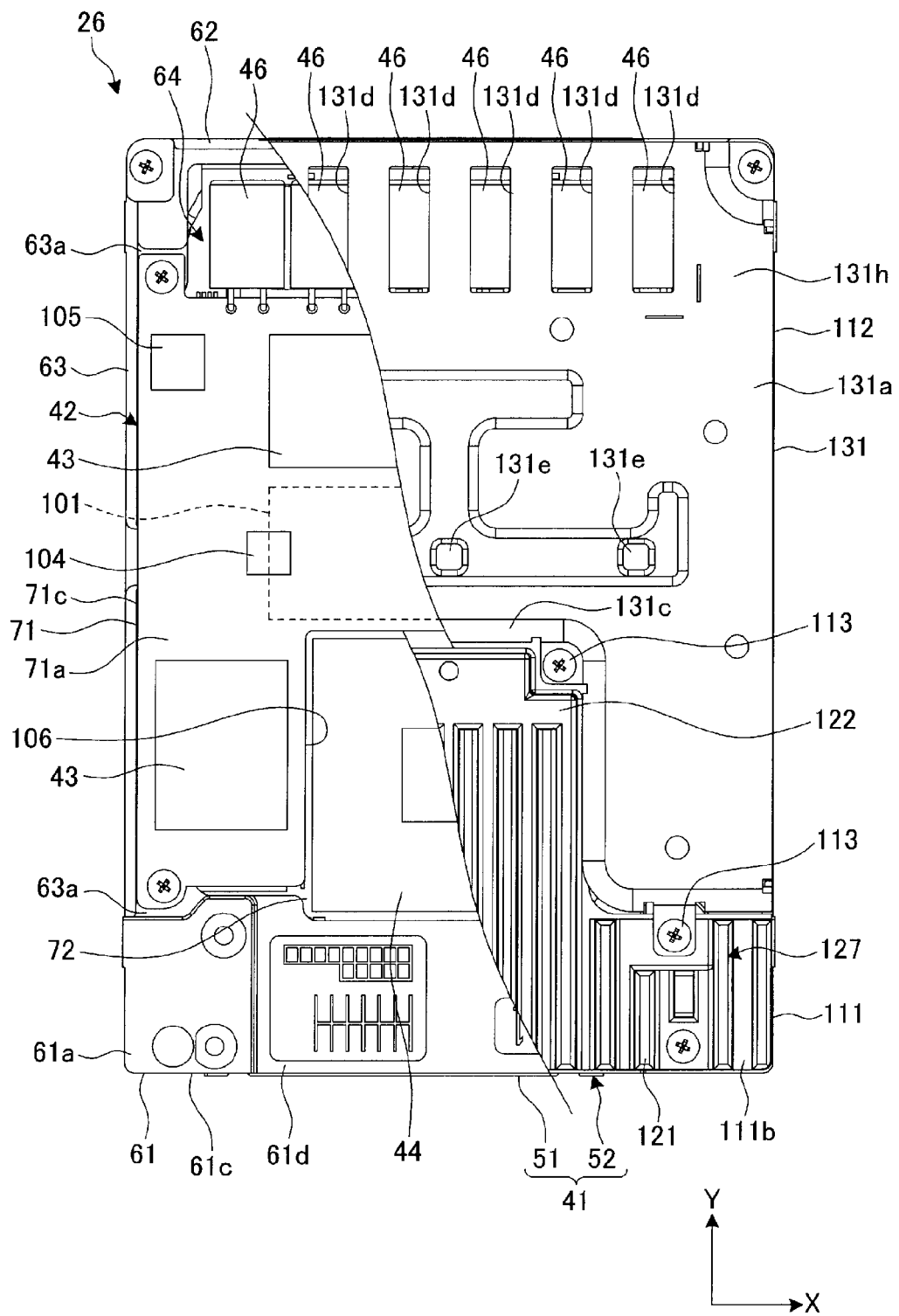
FIG. 3 is a partially cut-out plan view of the SSD according to the first embodiment.

FIG. 2 is an exploded perspective view of the SSD 26 according to the first embodiment. FIG. 3 is a partially cut-out plan view of the SSD 26 according to the first embodiment. As illustrated in FIG. 2, the SSD 26 includes a case 41, a circuit board 42, a plurality of flash memories 43, a controller 44, a plurality of dynamic random access memories (DRAMs) 45, a plurality of capacitors 46, and an external connector 47.

The case 41 is an example of a second housing. For example, the case 41 may be also referred to as a cover, a cover unit, a covering portion, or a wall. The circuit board 42 is an example of a board and a second board, and may be also referred to as a wiring board, for example. The flash memory 43 is an example of a first electronic component, and may be also referred to as a memory element, a semiconductor element a storage unit, a storage element, or a storage component, for example. The controller 44 is an example of a second electronic component and may be also referred to as a control unit, a control element, or a control component, for example. The external connector 47 is an example of the connector, and may be also referred to as a connection portion, for example.

Figure 4:
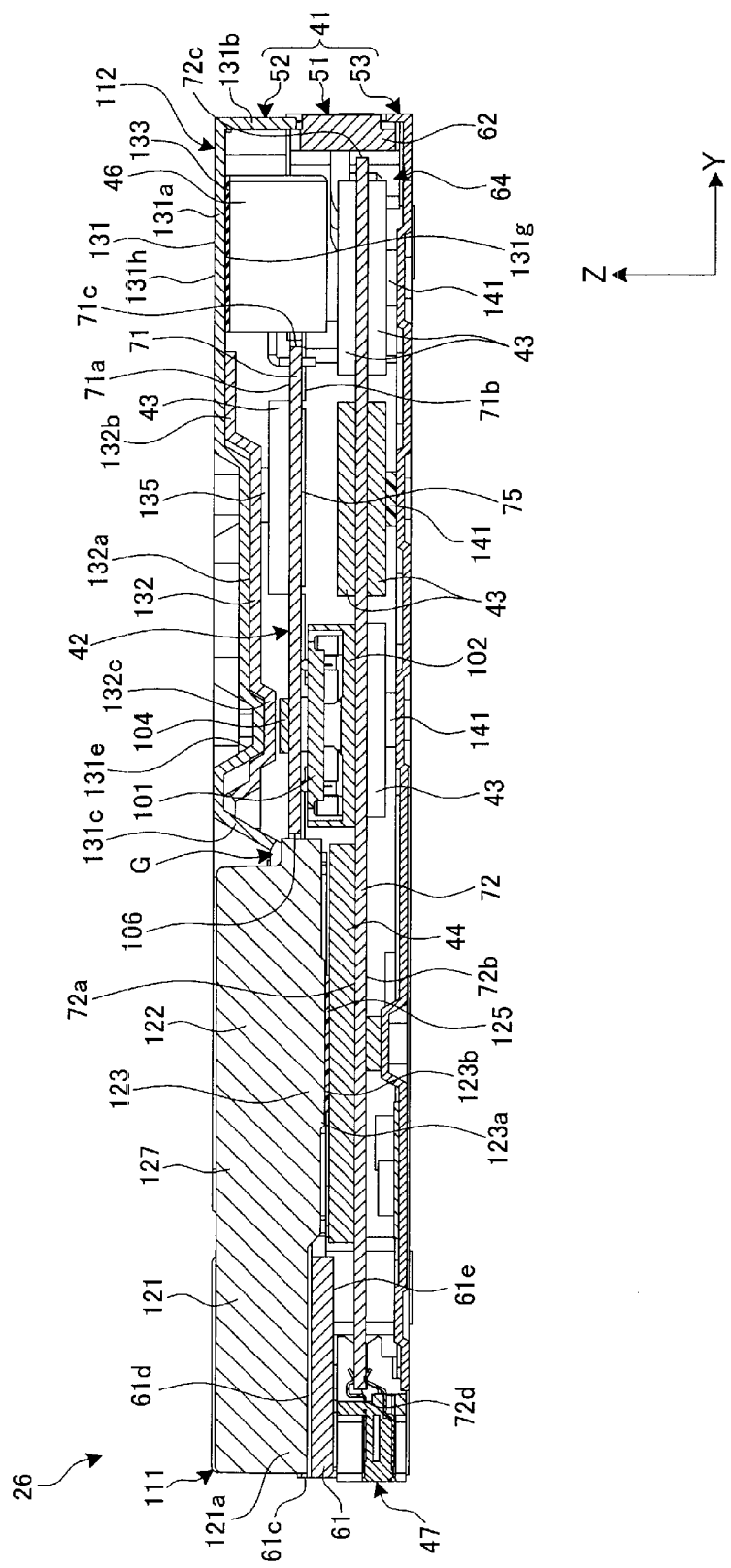
FIG. 4 is a cross-sectional view of the SSD according to the first embodiment taken along line F4-F4 in FIG. 2.
Figure 5:
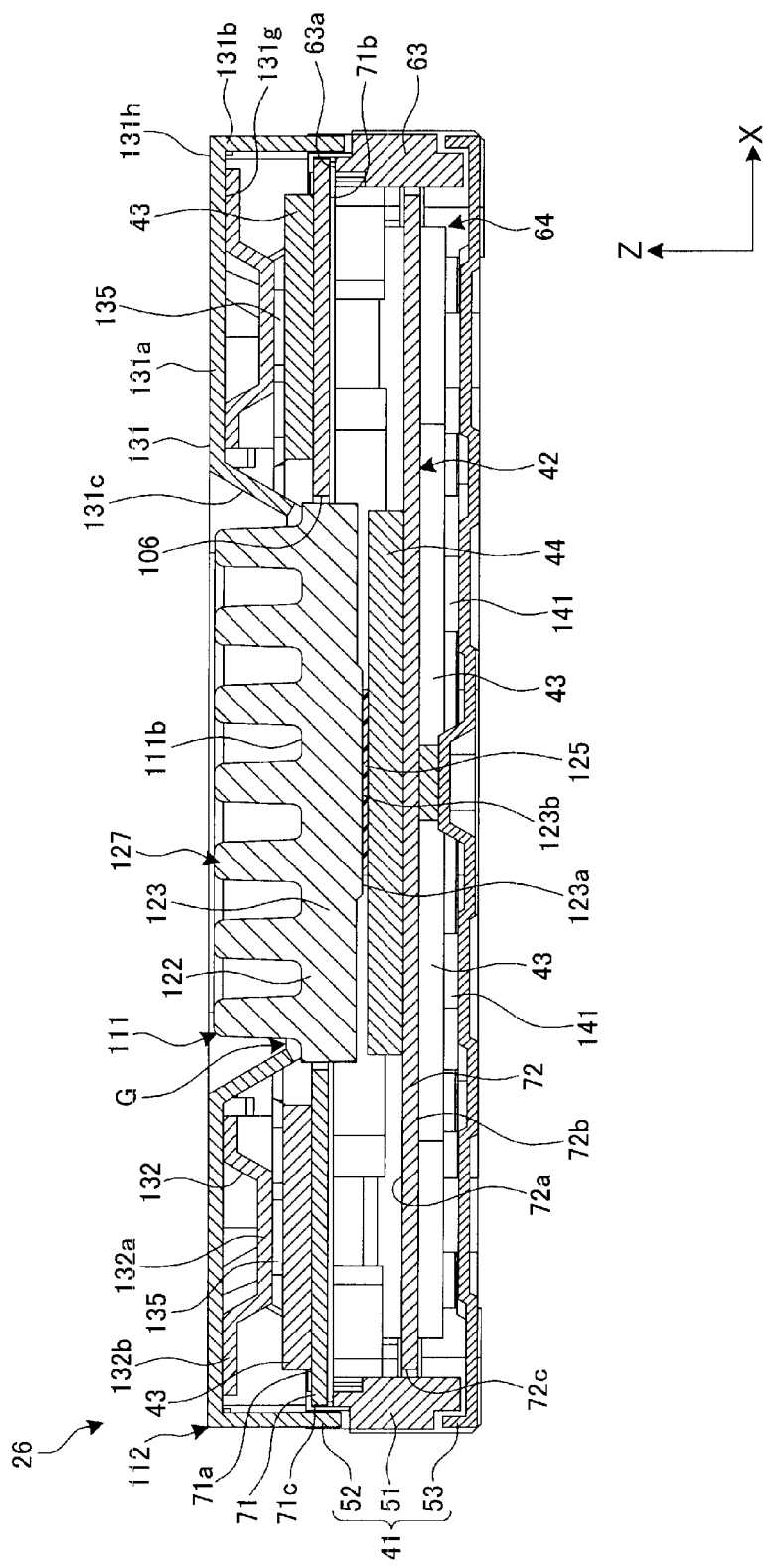
FIG. 5 is a cross-sectional view of the SSD according to the first embodiment taken along line F5-F5 in FIG. 2.

FIG. 4 is a cross-sectional view of the SSD 26 according to the first embodiment taken along line F4-F4 in FIG. 2. FIG. 5 is a cross-sectional view of the SSD 26 according to the first embodiment taken along line F5-F5 in FIG. 2. As illustrated in FIGS. 4 and 5, the case 41 includes a frame 51, a top cover 52, and a bottom cover 53. The top cover 52 is an example of the cover, and may be also referred to as a cooling portion, a heat dissipation portion, a covering portion, a wall, or a wall member, for example. The frame 51 may be also referred to as a wall, or a wall member, for example. The bottom cover 53 may be also referred to as a cooling portion, a heat dissipation portion, a covering portion, a wall, or a wall member, for example.

As illustrated in FIG. 2, the frame 51 is formed of metal such as aluminum alloy, and has a rectangular shape. The frame 51 is not limited thereto, and may have other shapes. The frame 51 includes a first side wall 61, a second side wall 62, and two third side walls 63.

The first side wall 61 and the second side wall 62 extend in the direction along the X axis. The first side wall 61 and the second side wall 62 are arranged at positions which are apart from each other in the direction along the Y axis. The first side wall 61 includes an upper surface 61a, a lower surface 61b, and a front end surface 61c.

The upper surface 61a is a substantially flat upward surface. A concave portion 61d is formed in a substantially center portion of the upper surface 61a in the direction along the X axis. The concave portion 61d is recessed from the upper surface 61a, and forms a surface substantially parallel to the upper surface 61a. The lower surface 61b is positioned opposite to the upper surface 61a. The front end surface 61c extends from an edge of the upper surface 61a to an edge of the lower surface 61b, and forms one end portion of the frame 51 in the direction along the Y axis. A hollow portion 61e is formed in the first side wall 61. The hollow portion 61e is a notch which opens to the lower surface 61b and the front end surface 61c of the first side wall 61.

The third side walls 63 are provided between an end portion of the first side wall 61 and an end portion of the second side wall 62. The third side walls 63 extend in the direction along the Y axis. The two third side walls 63 are arranged at positions which are apart from each other in the direction along the X axis. A substantially flat upward first support surface 63a is formed on the third side walls 63.

An accommodation portion 64 is provided on the inner side of the first to third side walls 61, 62, and 63 of the frame 51. The accommodation portion 64 is a portion surrounded by the first to third side walls 61, 62, and 63. The circuit board 42, the flash memory 43, the controller 44, the DRAM 45, and capacitors 46 are accommodated in the accommodation portion 64.

The top cover 52 is attached to the frame 51 from the above using a screw, for example. Thus, the top cover 52 closes the accommodation portion 64 of the frame 51 from the above. The bottom cover 53 is attached to the frame 51 from the bottom using a screw, for example. Thus, the bottom cover 53 closes the accommodation portion 64 of the frame 51 from the bottom.

As illustrated in FIG. 5, the circuit board 42 includes a first circuit board 71 and a second circuit board 72. The second circuit board 72 may be also referred to as a board. The first and second circuit boards 71 and 72 are printed wiring boards, for example. The first and second circuit boards 71 and 72 are not limited thereto, and may be other types of boards. The SSD 26 may have one printed wiring board, or may have three or more printed wiring boards.

The first circuit board 71 includes a first surface 71a, a second surface 71b, and a plurality of first end surfaces 71c. The first surface 71a is a surface toward the cover. The first surface 71a is a substantially flat surface facing the top cover 52. The first surface 71a is covered with the top cover 52. The plurality of flash memories 43 is provided on the first surface 71a.

The flash memory 43 is a NAND flash memory, for example. The first electronic component is not limited to the flash memory 43, and may be other components such as a resistive memory (ReRAM) and a ferroelectric memory (FeRAM). The flash memory 43, which stores data, is susceptible to high temperature condition, so it is important to dispose a heat removing mechanism therein.

The second surface 71b is positioned on a side opposite to the first surface 71a, and is a substantially flat surface facing the bottom cover 53. A portion of an end portion of the second surface 71b faces the first support surface 63a of the third side wall 63 of the frame 51. The first circuit board 71 is attached to a portion of the first support surface 63a of the third side wall 63, which surfaces an end portion of the second surface 71b, using a screw, for example.

As illustrated in FIG. 4, a plurality of pads 75 is provided on the second surface 71b. The pad 75 is an electrode which is provided in order to electrically connect a terminal of the flash memory 43, and may be also referred to as a conductive portion or a terminal, for example. In other words, the pad 75 is a portion for providing the flash memory 43. The flash memory 43 may be provided on the pad 75.

The first end surface 71c is provided between an edge of the first surface 71a and an edge of the second surface 71b. The first end surface 71c extends in a direction substantially orthogonal to a direction to which the first surface 71a extends (direction along the Z axis).

Figure 6:
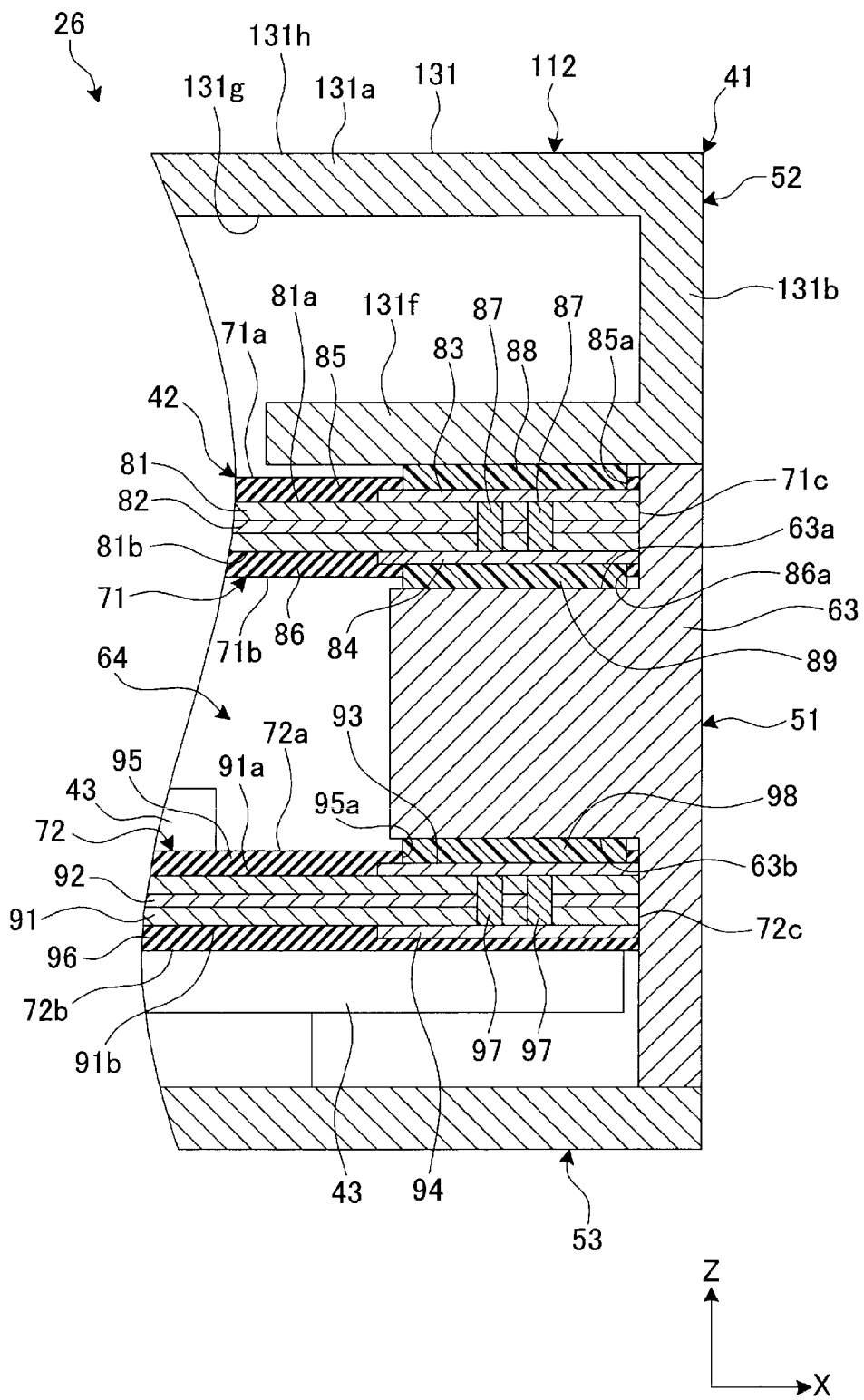
FIG. 6 is a cross-sectional view of a portion of the SSD according to the first embodiment.

FIG. 6 is a cross-sectional view of a portion of the SSD 26 according to the first embodiment. As illustrated in FIG. 6, the first circuit board 71 includes a first base portion 81, a first conductive layer 82, a first conductive pattern 83, a second conductive pattern 84, a first insulating layer 85, a second insulating layer 86, and a plurality of first vias 87. The first conductive layer 82 may be also referred to as a conductive layer. The first via 87 may be also referred to as a connection portion or a via.

The first base portion 81 is a portion obtained by stacking a plurality of insulating layers and a plurality of conductive layers. For example, wiring, a land, and a pattern such as a so-called solid-pattern are formed in the first base portion 81 using the conductive layers. The first base portion 81 includes a first formation surface 81a and a second formation surface 81b. The second formation surface 81b is positioned on a side opposite to the first formation surface 81a.

The first conductive layer 82 is provided in the first base portion 81. For this reason, the first conductive layer 82 is positioned between the first surface 71a and the second surface 71b. The first conductive layer 82 is a so-called solid-pattern, and is used as a ground of the first circuit board 71. The first conductive layer 82 is not limited to the ground, and may be used as a power supply layer, for example.

The first conductive pattern 83 is provided on the first formation surface 81a of the first base portion 81. The first conductive pattern 83 forms a pattern such as wiring and a land. The first insulating layer 85 covers the first conductive pattern 83. The first insulating layer 85 forms at least a portion of the first surface 71a of the first circuit board 71.

A first exposure opening 85a is provided on the first insulating layer 85. The first exposure opening 85a exposes at least a portion of the first conductive pattern 83. The first conductive pattern 83 which is exposed by the first exposure opening 85a forms a pattern on the first surface 71a of the first circuit board 71. A portion of the first conductive pattern 83 which is exposed by the first exposure opening 85a faces the top cover 52.

At least one portion of the first conductive pattern 83 which is exposed by the first exposure opening 85a is provided on an end portion of the first surface 71a of the first circuit board 71. The end portion of the first surface 71a is a portion along the first end surface 71c of the first circuit board 71. For example, the end portion of the first surface 71a is a portion between various electronic components such as the flash memory 43 which is provided on the first surface 71a, and the first end surface 71c. The first conductive pattern 83 which is exposed by the first exposure opening 85a may be formed in other positions.

The SSD 26 further includes a plurality of first thermal conductive sheets 88. The first thermal conductive sheet 88 may be also referred to as a heat transfer member. The first thermal conductive sheet 88 is disposed between a portion of the first conductive pattern 83, which is exposed by the first exposure opening 85a, and the top cover 52. For this reason, the first circuit board 71 supports the top cover 52 through the first thermal conductive sheet 88.

The number of the first thermal conductive sheets 88 may be more than or less than the number of portions of the first conductive pattern 83, which are exposed by the first exposure opening 85a. For example, a single first thermal conductive sheet 88 may be provided so as to cross over a plurality of first conductive patterns 83. In addition, the plurality of first thermal conductive sheets 88 may be bonded to a single first conductive pattern 83.

The first thermal conductive sheet 88 thermally connects the first conductive pattern 83 which is exposed by the first exposure opening 85a, and the top cover 52. The first thermal conductive sheet 88 has elasticity which is larger than that of the first circuit board 71, and is larger than that of the top cover 52. The first thermal conductive sheet 88 is elastically pressed between the first circuit board 71 and the top cover 52 so as to adhere to the first circuit board 71 and the top cover 52.

The second conductive pattern 84 is formed on the second formation surface 81b of the first base portion 81. The second conductive pattern 84 forms a pattern such as wiring and a land, for example. The second insulating layer 86 covers the second conductive pattern 84. The second insulating layer 86 forms at least a portion of the second surface 71b of the first circuit board 71.

A second exposure opening 86a is formed on the second insulating layer 86. The second exposure opening 86a exposes at least a portion of the second conductive pattern 84. The second conductive pattern 84 which is exposed by the second exposure opening 86a forms a pattern which is provided on the second surface 71b of the first circuit board 71. A portion of the second conductive pattern 84, which is exposed by the second exposure opening 86a faces the first support surface 63a of the third side wall 63 of the frame 51.

At least one portion of the second conductive pattern 84, which is exposed by the second exposure opening 86a is formed at the end portion of the second surface 71b of the first circuit board 71. The end portion of the second surface 71b is a portion along the first end surface 71c of the first circuit board 71. For example, the end portion of the second surface 71b is a portion between various electronic components which are provided on the second surface 71b, and the first end surface 71c. The second conductive pattern 84 which is exposed by the second exposure opening 86a may be formed at other positions.

The SSD 26 further includes a plurality of second thermal conductive sheets 89. The second thermal conductive sheet 89 may be also referred to as a heat transfer member, for example. The second thermal conductive sheet 89 is disposed between a portion of the second conductive pattern 84, which is exposed by the second exposure opening 86a, and the first support surface 63a of the third side wall 63. For this reason, the first circuit board 71 is supported by the first support surface 63a of the third side wall 63 through the second thermal conductive sheet 89.

The first support surface 63a of the third side wall 63 of the frame 51 supports the first circuit board 71 at both of the end portions and at the substantially center portion in a direction (direction along the Y axis) in which the first circuit board 71 extends, for example. The frame 51 may support other portions of the first circuit board 71.

The number of the second thermal conductive sheets 89 may be more than or less than the number of the second exposure opening 86a. For example, a single second thermal conductive sheet 89 may be provided so as to cross over a plurality of second conductive patterns 84. In addition, the plurality of second thermal conductive sheets 89 may be bonded to a single second conductive pattern 84.

The second thermal conductive sheet 89 thermally connects the second conductive pattern 84 which is exposed by the second exposure opening 86a, and the frame 51. The second thermal conductive sheet 89 has elasticity which is larger than that of the first circuit board 71 and larger than that of the frame 51. The second thermal conductive sheet 89 is elastically pressed between the first circuit board 71 and the frame 51 so as to adhere to the first circuit board 71 and the frame 51.

The plurality of first vias 87 is provided on the first base portion 81. The plurality of first vias 87 electrically and thermally connects the first conductive layer 82, the first conductive pattern 83, and the second conductive pattern 84.

The flash memory 43 which is provided on the first circuit board 71 overlaps the first conductive layer 82 in a thickness direction (direction along the Z axis) of the first circuit board 71. The flash memory 43 may be arranged at other positions.

The second circuit board 72 overlaps the first circuit board 71 in the direction along the X axis with an interval in the direction along the Z axis. The direction along the Z axis is an example of a thickness direction of the second board. The second circuit board 72 includes a third surface 72a, a fourth surface 72b, and a second end surface 72c. The third surface 72a is an example of a surface toward the cover, and may be also referred to as a surface, for example.

The third surface 72a is a substantially flat surface toward the top cover 52. The third surface 72a faces the second surface 71b of the first circuit board 71. The plurality of flash memories 43, the controller 44, and the plurality of DRAMs 45 are provided on the third surface 72a.

A second support surface 63b is provided on the third side wall 63 of the frame 51. The second support surface 63b is positioned on side opposite to the first support surface 63a and is a substantially flat downward surface. A portion of an end portion of the third surface 72a of the second circuit board 72 faces the second support surface 63b of the third side wall 63 of the frame 51.

The second circuit board 72 is attached to a portion of the second support surface 63b of the third side wall 63 of the frame 51 using a screw. The portion of the second support surface 63b faces the end portion of the third surface 72a. The second circuit board 72 is attached to the frame 51 at a position which is apart from the first circuit board 71, in a direction to which the third surface 72a extends (direction along the Z axis). That is, the frame 51 is disposed between the first circuit board 71 and the second circuit board 72.

The controller 44 is a system-on-chip (SoC), for example. The second electronic component is not limited thereto.

When the SSD 26 operates, an amount of heat generated by the controller 44 is larger than an amount of heat generated by the flash memory 43. The controller 44 may control the plurality of flash memories 43.

The controller 44 has a thickness thicker than that of the flash memory 43. In other words, the controller 44 has a length longer than that of the flash memory 43 in the direction in which the third surface 72a of the second circuit board 72 is directed (direction along the Z axis). Dimensions of the flash memory 43 and the controller 44 are not limited thereto.

The fourth surface 72b is positioned on a side opposite to the third surface 72a, and is a substantially flat surface toward the bottom cover 53. The bottom cover 53 covers the fourth surface 72b. A plurality of flash memories 43 is provided on the fourth surface 72b.

The second end surface 72c extends between an edge of the third surface 72a and an edge of the fourth surface 72b. The second end surface 72c extends in a direction substantially orthogonal to a direction in which the third surface 72a extends (direction along the Z axis).

As illustrated in FIG. 4, the external connector 47 is provided on the second circuit board 72. For example, the external connector 47 is provided at one end portion of the second circuit board 72 in the direction along the Y axis and is arranged at the notch 72d. The notch 72d opens towards the second end surface 72c of the second circuit board 72. The end portion of the second circuit board 72 at which the external connector 47 is provided is closer to the first side wall 61 than to the second and third side walls 62 and 63 of the frame 51. The external connector 47 is buried in the hollow portion 61e, which is provided in the first side wall 61 of the frame 51.

As illustrated in FIG. 2, the external connector 47 includes two support pieces 47a. The support piece 47a extends in the direction along the X axis, and overlaps the second circuit board 72 in the direction along the Z axis. The support piece 47a is supported by the third surface 72a of the second circuit board 72.

The external connector 47 is exposed to the outside of the SSD 26. The external connector 47 is electrically connected to the module board 22, for example, through a connector, which is connected to the module board 22 of the server module 5. Thus, the SSD 26 may receive electric power from the server module 5 or the module enclosure 4, or may transmit data.

As illustrated in FIG. 6, the second circuit board 72 includes a second base portion 91, a second conductive layer 92, a third conductive pattern 93, a fourth conductive pattern 94, a third insulating layer 95, a fourth insulating layer 96, and a plurality of second vias 97. The second conductive layer 92 may be also referred to as a conductive layer, for example. The second via 97 may be also referred to as a connection portion, for example.

The second base portion 91 is a portion, for example, obtained by stacking a plurality of insulating layers and a plurality of conductive layers. For example, wiring, a land, and a pattern such as a so-called solid-pattern are formed in the second base portion 91 using the conductive layers. The second base portion 91 includes a third formation surface 91a and a fourth formation surface 91b. The fourth formation surface 91b is positioned on a side opposite to the third formation surface 91a.

The second conductive layer 92 is formed in the second base portion 91. For this reason, the second conductive layer 92 is positioned between the third surface 72a and the fourth surface 72b. The second conductive layer 92 is a so-called solid-pattern and is used as a ground of the second circuit board 72. The second conductive layer 92 is not limited to the ground, and may be used as a power supply layer, for example.

The third conductive pattern 93 is formed on the third formation surface 91*a* of the second base portion 91. The third conductive pattern 93 forms a pattern such as wiring and a land. The third insulating layer 95 covers the third conductive pattern 93. The third insulating layer 95 forms at least a portion of the third surface 72*a* of the second circuit board 72.

A third exposure opening 95*a* is formed on the third insulating layer 95. The third exposure opening 95*a* exposes at least a portion of the third conductive pattern 93. The third conductive pattern 93 which is exposed by the third exposure opening 95*a* forms a pattern which is formed on the third surface 72*a* of the second circuit board 72. A portion of the third conductive pattern 93 which is exposed by the third exposure opening 95*a* faces the second support surface 63*b* of the third side wall 63 of the frame 51.

At least the portion of the third conductive pattern 93 which is exposed by the third exposure opening 95*a* is formed on an end portion of the third surface 72*a* of the second circuit board 72. The end portion of the third surface 72*a* is a portion along the second end surface 72*c* of the second circuit board 72. For example, the end portion of the third surface 72*a* is a portion between various electronic components such as the flash memory 43 which is provided on the third surface 72*a*, and the second end surface 72*c*. The third conductive pattern 93 which is exposed by the third exposure opening 95*a* may be formed at other positions.

The SSD 26 further includes a plurality of third thermal conductive sheets 98. The third thermal conductive sheet 98 may be also referred to as a heat transfer member, for example. The third thermal conductive sheet 98 is disposed between a portion of the third conductive pattern 93, which is exposed by the third exposure opening 95*a*, and the second support surface 63*b* of the third side wall 63. For this reason, the second circuit board 72 is supported by the second support surface 63*b* of the third side wall 63 through the third thermal conductive sheet 98.

The second support surface 63*b* of the third side wall 63 of the frame 51 supports the second circuit board 72 at both end portions and at a substantially center portion in a direction (direction along the Y axis) in which the second circuit board 72 extends, for example. The frame 51 may support other portions of the second circuit board 72.

The number of the third thermal conductive sheets 98 may be more than or less than the number of the third exposure opening 95*a*. For example, a single third thermal conductive sheet 98 may be provided so as to cross over a plurality of third conductive patterns 93. In addition, the plurality of third thermal conductive sheets 98 may be bonded to a single third conductive pattern 93.

The third thermal conductive sheet 98 thermally connects the third conductive pattern 93 which is exposed by the third exposure opening 95*a*, and the frame 51. The third thermal conductive sheet 98 has elasticity which is larger than that of the second circuit board 72 and larger than that of the frame 51. The third thermal conductive sheet 98 is elastically pressed between the second circuit board 72 and the frame 51 so as to adhere to the second circuit board 72 and the frame 51.

The fourth conductive pattern 94 is formed on the fourth formation surface 91*b* of the second base portion 91. The fourth conductive pattern 94 forms a pattern such as wiring and a land. The fourth insulating layer 96 covers the fourth conductive pattern 94. The fourth insulating layer 96 forms at least a portion of the fourth surface 72*b* of the second circuit board 72.

The plurality of second vias 97 is formed in the second base portion 91. The plurality of second vias 97 electrically and thermally connects the second conductive layer 92, the third conductive pattern 93, and the fourth conductive pattern 94.

The flash memory 43 and the controller 44 which are provided on the second circuit board 72 overlap the second conductive layer 92 in a thickness direction (direction along the Z axis) of the second circuit board 72. The flash memory 43 and the controller 44 may be arranged at other positions.

As illustrated in FIG. 4, the first circuit board 71 further includes a first board connector 101. The first board connector 101 may be also referred to as a connector, a protrusion portion or a connection portion, for example. The first board connector 101 is provided on the second surface 71*b*, and protrudes from the second surface 71*b* toward the third surface 72*a* of the second circuit board 72.

The second circuit board 72 further includes a second board connector 102. The second board connector 102 may be also referred to as a connector, a protrusion portion, or a connection portion, for example. The second board connector 102 is provided on the third surface 72*a*, and protrudes from the third surface 72*a* toward the second surface 71*b* of the first circuit board 71.

The first board connector 101 is connected to the second board connector 102. Thus, the first circuit board 71 and the second circuit board 72 are electrically connected to each other. The flash memory 43 which is provided on the first circuit board 71, and the controller 44 which is provided on the second circuit board 72 are electrically connected to each other. For this reason, the controller 44 enables control of the flash memory 43 which is provided on the second circuit board 72, and the flash memory 43 which is provided on the first circuit board 71.

The first board connector 101 is arranged at a substantially center portion of the first circuit board 71 in the direction (direction along the Y axis) in which the first circuit board 71 extends. The second board connector 102 is arranged at the substantially center portion of the second circuit board 72 in the direction (direction along the Y axis) in which the second circuit board 72 extends. For this reason, the first board connectors 101 supports the first circuit boards 71 at the substantially center portion thereof, and the second board connector 102 supports the second circuit board 72 at the substantially center portion thereof. The first and second board connectors 101 and 102 may be arranged at other positions.

As illustrated in FIG. 3, a plurality of electronic components 104 and 105 is provided on the first surface 71*a* of the first circuit board 71. The plurality of electronic components 104 and 105 correspond to various components such as inductors, for example. Some of the plurality of electronic components 104 are arranged at a position which overlaps the first board connector 101 in the plane directions (directions along the X and Y axes) of the first circuit board 71. The electronic component 105 has a length (thickness) greater than a length (thickness) of the electronic component 104 in the direction along the Z axis.

As illustrated in FIG. 4, some of the plurality of flash memories 43 which are provided on the fourth surface 72*b* of the second circuit board 72 are arranged so as to overlap the second board connector 102 in the thickness direction (direction along the Z axis) of the second circuit board 72. In other words, the flash memory 43 is provided on the fourth surface 72b at a position which overlaps the second board connector 102 in a direction in which the fourth surface 72b is directed.

An opening portion 106 is provided on the first circuit board 71. The opening portion 106 may be also referred to as an insertion portion, for example. The opening portion 106 is, for example, a notch which opens towards the first end surface 71c of the first circuit board 71. The first end surface 71c on which the opening portion 106 is provided is one end surface of the first circuit board 71 in the direction along the Y axis, and is closer to the first side wall 61 than to the second and third side walls 62 and 63. The opening portion 106 is not limited thereto, and may be a hole or a slit.

The opening portion 106 is formed at a position corresponding to the controller 44 which is provided on the second circuit board 72. That is, the opening portion 106 is arranged at a position which overlaps the controller 44 in the direction in which the third surface 72a of the second circuit board 72 extends (direction along the Y axis). Through the opening portion 106, the controller 44 is exposed to the top cover 52. In other words, the first circuit board 71 is formed so as to avoid an area between the controller 44 and the top cover 52 by providing the opening portion 106.

The opening portion 106 is larger than that of the controller 44. In other words, the controller 44 is surrounded by an edge of the first circuit board 71, which forms the opening portion 106, in a plan view from the direction in which the third surface 72a of the second circuit board 72 is directed (direction along the Z axis). The size of the opening portion 106 is not limited thereto.

The plurality of capacitors 46 is provided on the first circuit board 71. The capacitor 46 is arranged between the first end surface 71c of the first circuit board 71, and the second side wall 62 of the frame 51. The first end surface 71c facing the capacitor 46 is another end surface of the first circuit board 71 in the direction along the Y axis. The plurality of capacitors 46 extends in the direction along the Y axis, and are arranged so as to be aligned along the X axis. In other words, the capacitor 46 extends in a direction intersecting with the thickness direction of the first circuit board 71.

The capacitor 46 is arranged at a position which is apart from the controller 44, not from the flash memory 43. For this reason, heating of the capacitor 46 due to heat generated by the controller 44 is suppressed.

As illustrated in FIGS. 3 and 4, the top cover 52 includes a controller cover 111, a memory cover 112, and a plurality of screws 113. The controller cover 111 is an example of the second portion, and the memory cover 112 is an example of the first portion. The controller cover 111 and the memory cover 112 may be also referred to as a cover, a heat dissipation portion, a cooling portion, a covering portion, or a covering member, for example.

The controller cover 111 is formed of aluminum alloy, for example. A material of the controller cover 111 is not limited thereto. The controller cover 111 is formed through casting, for example, and black insulating paint is applied on a surface of the controller cover 111. The controller cover 111 substantially has a T-shape. The controller cover 111 includes a first heat dissipative portion 121 and a second heat dissipative portion 122. The first and second heat dissipative portions 121 and 122 may be also referred to as an extension portion or an extension member, for example.

The first heat dissipative portion 121 has a plate shape which extends along the first side wall 61 of the frame 51. The first heat dissipative portion 121 is supported by the upper surface 61a of the first side wall 61. For this reason, the controller cover 111 is closer to the external connector 47 than to the memory cover 112. The first heat dissipative portion 121 of the controller cover 111 overlaps the external connector 47 in the plane direction (direction along the Y axis) of the second circuit board 72.

The first heat dissipative portion 121 includes a convex portion 121a which protrudes toward the concave portion 61d of the first side wall 61. The convex portion 121a is arranged at a position corresponding to the concave portion 61d, and is fit in the concave portion 61d. Thus, the controller cover 111 is easily positioned with respect to the frame 51.

The second heat dissipative portion 122 is a portion which extends in the direction along the Y axis from the substantially center portion of the first heat dissipative portion 121 in the direction along the X axis. The length of the second heat dissipative portion 122 in the direction along the X axis is smaller than the length of the first heat dissipative portion 121 in the direction along the X axis. The lengths of the first heat dissipative portion 121 and the second heat dissipative portion 122 are not limited thereto.

The second heat dissipative portion 122 covers the controller 44 of the second circuit board 72, which is exposed by the opening portion 106 of the first circuit board 71. The second heat dissipative portion 122 may cover at least a portion of the controller 44. The second heat dissipative portion 122 may cover other components which are provided on the first and second circuit boards 71 and 72.

A protrusion portion 123 is provided on the second heat dissipative portion 122. The protrusion portion 123 protrudes toward the controller 44 which is provided on the second circuit board 72, and passes through the opening portion 106. In other words, at least a portion of the protrusion portion 123 is contained in the opening portion 106. The protrusion portion 123 is apart from the edge of the first circuit board 71, which forms the opening portion 106.

The protrusion portion 123 includes a contact portion 123a. The contact portion 123a protrudes toward the controller 44. A contact surface 123b which faces the controller 44 is provided on the contact portion 123a. The contact surface 123b is a portion at which paint is removed through cutting, and a material of the controller cover 111 is exposed.

The SSD 26 further includes a fourth thermal conductive sheet 125. The fourth thermal conductive sheet 125 may be also referred to as a heat transfer member, for example. The fourth thermal conductive sheet 125 is disposed between the contact surface 123b of the protrusion portion 123, and the controller 44. For this reason, the controller 44 supports the controller cover 111 through the fourth thermal conductive sheet 125.

The fourth thermal conductive sheet 125 thermally connects the protrusion portion 123 of the controller cover 111 and the controller 44. The fourth thermal conductive sheet 125 has elasticity which is larger than that of the controller cover 111 and is larger than that of the controller 44. The fourth thermal conductive sheet 125 is elastically pressed between the controller cover 111 and the controller 44 so as to adhere to the controller cover 111 and the controller 44. The fourth thermal conductive sheet 125 handles variation in dimensions of a gap between the contact surface 123b of the protrusion portion 123, and the controller 44.

As illustrated in FIG. 2, the controller cover 111 further includes an inner surface 111a and an outer surface 111b. The inner surface 111a is an example of the second surface. The outer surface 111b is an example of the third surface. The inner surface 111a faces the inside of the SSD 26. For example, a portion of the inner surface 111a which is formed on the second heat dissipative portion 122 faces the second circuit board 72. The outer surface 111b is positioned on a side opposite to the inner surface 111a, and faces the outside of the SSD 26.

The controller cover 111 further includes a plurality of fins 127. The fin 127 may be also referred to as a heat dissipation portion, a cooling portion, or a protrusion portion, for example. The fin 127 is formed on the outer surface 111b of the controller cover 111. The fin 127 is a plate portion which extends in the direction along the Y axis. In other words, the fin 127 extends in a direction along an air flow generated by the fan 25 of the server module 5. The direction in which the fin 127 extends is not limited thereto.

As illustrated in FIGS. 4 and 5, the memory cover 112 includes a covering member 131, a protruding member 132, and a seal 133. The covering member 131 and the protruding member 132 are formed of aluminum alloy, for example. The material of the covering member 131 and the protruding member 132 is not limited thereto.

The covering member 131 is formed of a metal plate which is subjected to bending processing, for example. The covering member 131 may be formed by other methods. The covering member 131 includes a first covering portion 131a, a plurality of first edge portions 131b, and a plurality of second edge portions 131c.

The first covering portion 131a covers at least a portion of the first surface 71a of the first circuit board 71. The first covering portion 131a may cover, for example, a portion of the second circuit board 72 which is exposed by the opening portion 106.

As illustrated in FIG. 3, a plurality of holes 131d is provided in the first covering portion 131a. The plurality of holes 131d is provided at positions corresponding to the plurality of capacitors 46. Some of the capacitors 46 may be inserted into the holes 131d. For this reason, the hole 131d allows the capacitor 46 to be fit in the first covering portion 131a.

A plurality of first projecting portions 131e is provided on the first covering portion 131a. The first projecting portion 131e is formed through drawing processing, for example. The first projecting portion 131e protrudes toward the first circuit board 71. The plurality of first projecting portions 131e overlaps the substantially center portion of the first circuit board 71 in the direction along the Y axis, and are arranged in the direction along the X axis. The first projecting portion 131e is not limited thereto.

As illustrated in FIGS. 4 and 5, the first edge portion 131b extends from an end portion of the first covering portion 131a, which overlaps the second or the third side wall 62 or 63, toward the second or the third side wall 62 or 63. The first edge portion 131b abuts the corresponding second or third side wall 62 or 63. Thus, the memory cover 112 is supported by the frame 51.

As illustrated in FIG. 6, an extension portion 131f is provided on a portion of the first edge portion 131b. The extension portion 131f extends from the first edge portion 131b in a direction along the first surface 71a of the first circuit board 71. That is, the extension portion 131f is connected to the first covering portion 131a through the first edge portion 131b. The extension portion 131f overlaps the first conductive pattern 83 which is provided at the end portion of the first circuit board 71.

The above-described first thermal conductive sheet 88 is disposed between a portion of the first conductive pattern 83, which is exposed by the first exposure opening 85a, and the extension portion 131f of the memory cover 112. For this reason, the first thermal conductive sheet 88 thermally connects the first conductive pattern 83 and the extension portion 131f of the memory cover 112.

As illustrated in FIG. 4, the second edge portion 131c extends from an end portion of the first covering portion 131a to the second heat dissipative portion 122, and the end portion of the first covering portion 131a is adjacent to the second heat dissipative portion 122 of the controller cover 111. A tip end of the second edge portion 131c is slightly apart from the second heat dissipative portion 122. In other words, a space (gap) G is formed between a portion of the memory cover 112 and the controller cover 111. Accordingly, a portion of the memory cover 112 is thermally separated from the controller cover 111. Further, at least a portion of the gap G extends linearly and is aligned with an edge of the controller 44. In other words, the portion of the gap G extends in parallel to an edge of the controller 44.

The covering member 131 further includes an inner surface 131g and an outer surface 131h. The inner surface 131g is an example of the second surface and an outer surface 131h is an example of the third surface. The inner surface 131g faces the inside of the SSD 26. For example, a portion of the inner surface 131g faces the first circuit board 71. The outer surface 131h is positioned on a side opposite to the inner surface 131g and faces the outside of the SSD 26.

The protruding member 132 is formed of a metal plate which is subjected to bending processing, for example. The protruding member 132 may be formed using other methods. The protruding member 132 is attached to the inner surface 131g of the covering member 131. The protruding member 132 includes a second covering portion 132a, a fixation portion 132b, and a plurality of second projecting portions 132c. The second projecting portion 132c may be also referred to as a protrusion portion or a convex portion, for example.

The second covering portion 132a is arranged between the first covering portion 131a and the first circuit board 71, and covers a portion of the first circuit board 71. The second covering portion 132a covers at least some of the plurality of flash memories 43 which is provided on the first surface 71a of the first circuit board 71. In other words, the second covering portion 132a faces the plurality of flash memories 43 which is provided on the first surface 71a of the first circuit board 71. The second covering portion 132a is formed so as to avoid the electronic component 105 which is provided on the first surface 71a.

The fixation portion 132b extends from an end portion of the second covering portion 132a to the first covering portion 131a of the covering member 131. The fixation portion 132b is attached to the first covering portion 131a through caulking, for example. Thus, the second covering portion 132a is supported at a position at which a gap is formed between the second covering portion 132a and the first covering portion 131a, and an interval is formed between the second covering portion 132a and the flash memory 43.

The memory cover 112 has a substantially box shape and has a space between the covering member 131 and the protruding member 132, by attaching the fixation portion 132b of the protruding member 132 to the covering member 131. A box-shaped portion of the memory cover 112 substantially has a U-shape along the second heat dissipative portion 122 of the controller cover 111 in a plan view from the direction along the Z axis. That is, the box-shaped portion of the memory cover 112 includes a portion which extends along the Y axis, and a portion which extends along the X axis. Such a memory cover 112 suppresses deformation of the memory cover 112 in the directions along the Y axis and the X axis.

The second projecting portion 132c is provided on the second covering portion 132a at a position corresponding to the first projecting portion 131e. In other words, the second projecting portion 132c overlaps the first projecting portion 131e in the direction along the Y axis.

The second projecting portion 132c is formed through drawing processing, for example. The second projecting portion 132c protrudes toward the first surface 71a of the first circuit board 71. The first projecting portion 131e is fit in a recessed portion of the second projecting portion 132c. The first projecting portion 131e is in contact with the second projecting portion 132c, and is thermally connected to the second projecting portion 132c.

A convex portion of the second projecting portion 132c is in contact with the electronic component 104 which is positioned somewhere on the first circuit board 71, through an insulating thermal conductive sheet, for example. Thus, the second projecting portion 132c is thermally connected to the first circuit board 71 through the electronic component 104. The second projecting portion 132c may be in contact with, for example, the conductive pattern which is provided on the first circuit board 71 or the first circuit board 71, without limit to the electronic component 104.

The second projecting portion 132c is in contact with the electronic component 104 which is arranged at the substantially center portion of the first circuit board 71 in the direction along the Y axis. For this reason, the second projecting portion 132c supports the first circuit board 71, and suppresses bending of the first circuit board 71.

The second projecting portion 132c is in contact with the electronic component 104 at a position which overlaps the first and second board connectors 101 and 102 in the direction along the Y axis. For this reason, the first circuit board 71 and the electronic component 104 are held between the second projecting portion 132c, and the first and second board connectors 101 and 102.

The seal 133 closes the plurality of holes 131d of the covering member 131. For this reason, the seal 133 suppresses dust or moisture from coming into the case 41 from the hole 131d. The seal 133 is in contact with the plurality of capacitors 46 and supports the plurality of capacitors 46. The seal 133 is disposed between the capacitor 46 and the covering member 131, and suppresses direct contact of the capacitor 46 with the covering member 131.

The SSD 26 further includes a plurality of fifth thermal conductive sheet 135. The fifth thermal conductive sheet 135 may be also referred to as a heat transfer member, for example. The fifth thermal conductive sheet 135 is disposed between the second covering portion 132a of the protruding member 132 and the flash memory 43 provided on the first surface 71a of the first circuit board 71. For this reason, the flash memory 43 supports the memory cover 112 through the fifth thermal conductive sheet 135.

The fifth thermal conductive sheet 135 thermally connects the memory cover 112 and the flash memory 43 which is provided on the first surface 71a. The fifth thermal conductive sheet 135 has elasticity which is larger than that of the memory cover 112, and is larger than that of the flash memory 43. The fifth thermal conductive sheet 135 is elastically pressed between the memory cover 112 and the flash memory 43 so as to adhere to the memory cover 112 and the flash memory 43. The fifth thermal conductive sheet 135 handles variation in dimensions of an interval between the second covering portion 132a of the protruding member 132, and the flash memory 43.

As illustrated in FIG. 2, the screw 113 fixes the controller cover 111 and the memory cover 112. The controller cover 111 is partially in contact with the memory cover 112 in order to attach the controller cover 111 to the memory cover 112. The screw 113 fixes the controller cover 111 and the memory cover 112 which are attached to each other, to the frame 51.

The bottom cover 53 is formed of aluminum alloy, for example. The bottom cover 53 is formed of a metal plate which is subjected to bending processing, for example. The bottom cover 53 may be formed of other materials, and may be formed by using other methods.

As illustrated in FIGS. 4 and 5, the bottom cover 53 covers the fourth surface 72b of the second circuit board 72 and the plurality of flash memories 43 which are provided on the fourth surface 72b of the second circuit board 72. The bottom cover 53 is supported by the first to third side walls 61 to 63 of the frame 51.

The SSD 26 further includes a plurality of sixth thermal conductive sheets 141. The sixth thermal conductive sheet 141 may be also referred to as a heat transfer member, for example. The sixth thermal conductive sheet 141 is disposed between the flash memory 43 which is provided on the fourth surface 72b, and the bottom cover 53. For this reason, the flash memory 43 supports the bottom cover 53 through the sixth thermal conductive sheet 141.

The sixth thermal conductive sheet 141 thermally connects the flash memory 43 which is provided on the fourth surface 72b, and the bottom cover 53. The sixth thermal conductive sheet 141 has elasticity which is larger than that of the bottom cover 53, and is larger than that of the flash memory 43. The sixth thermal conductive sheet 141 is elastically pressed between the bottom cover 53 and the flash memory 43 so as to adhere to the bottom cover 53 and the flash memory 43.

As illustrated in FIG. 2, the bottom cover 53 includes an edge piece 145. The edge piece 145 protrudes toward the second circuit board 72 from one end portion of the bottom cover 53 in the direction along the Y axis. The edge piece 145 presses the support piece 47a of the external connector 47 which is supported by the second circuit board 72, on the first side wall 61 of the frame 51. Thus, the external connector 47 and the second circuit board 72 are held between the first side wall 61 and the edge piece 145.

When the above-described SSD 26 operates, the flash memory 43 and the controller 44 generate heat. The flash memory 43 and the controller 44 are cooled as follows, for example. Cooling of the flash memory 43 and the controller 44 is not limited to the following descriptions.

The flash memory 43 which is provided on the first surface 71a of the first circuit board 71 illustrated in FIG. 4 is thermally connected to the memory cover 112 through the fifth thermal conductive sheet 135. For this reason, heat generated from the flash memory 43 is transferred to the memory cover 112 through the fifth thermal conductive sheet 135.

The flash memory 43 which is provided on the first surface 71a of the first circuit board 71 overlaps the first conductive layer 82 illustrated in FIG. 6 in the plane direction (direction along the Y axis) of the first circuit board 71. For this reason, heat generated from the flash memory 43 is transferred to the first and second conductive patterns 83 and 84 from the first conductive layer 82 through the first via 87. Heat transferred to the first conductive pattern 83 is further transferred to the memory cover 112 through the first thermal conductive sheet 88. Heat transferred to the second conductive pattern 84 is further transferred to the frame 51 through the second thermal conductive sheet 89.

As described above, heat generated from the flash memory 43, which is provided on the first surface 71a of the first circuit board 71, is transferred to the memory cover 112 and the frame 51. Accordingly, the flash memory 43 is cooled.

The flash memory 43, which is provided on the fourth surface 72b of the second circuit board 72 illustrated in FIG. 4, is thermally connected to the bottom cover 53 through the sixth thermal conductive sheet 141. For this reason, heat generated from the flash memory 43 is transferred to the bottom cover 53 through the sixth thermal conductive sheet 141.

The flash memory 43 which is provided on the fourth surface 72b of the second circuit board 72 overlaps the second conductive layer 92 illustrated in FIG. 6 in the plane direction (direction along the Y axis) of the second circuit board 72. For this reason, heat generated from the flash memory 43 is transferred to the third conductive pattern 93 from the second conductive layer 92 through the second via 97. Heat transferred to the third conductive pattern 93 is further transferred to the frame 51 through the third thermal conductive sheet 98.

As described above, heat generated from the flash memory 43, which is provided on the fourth surface 72b of the second circuit board 72, is transferred to the bottom cover 53 and the frame 51. Accordingly, the flash memory 43 is cooled.

The controller 44 illustrated in FIG. 4 is thermally connected to the controller cover 111 through the fourth thermal conductive sheet 125. For this reason, heat generated from the controller 44 is transferred to the controller cover 111 through the fourth thermal conductive sheet 125.

The controller 44 of FIG. 6 overlaps the second conductive layer 92 in the plane direction (direction along the Y axis) of the second circuit board 72. For this reason, heat generated from the controller 44 is transferred to the third conductive pattern 93 from the second conductive layer 92 through the second via 97. Heat transferred to the third conductive pattern 93 is further transferred to the frame 51 through the third thermal conductive sheet 98.

As described above, heat generated from the controller 44 is transferred to the controller cover 111 and the frame 51. The plurality of fins 127, which is provided on the controller cover 111, contributes to increase a surface area of the controller cover 111. Wind generated by the fan 25 of the server module 5 flows along the fin 127. For this reason, the controller cover 111 is cooled with high efficiency and the controller 44 is also cooled.

An amount of heat generated by the controller 44 is greater than an amount of heat generated by the flash memory 43. For this reason, heat transferred to the controller cover 111 is greater than heat transferred to the memory cover 112. However, since the space (gap) G is formed between the portion of the memory cover 112 and the controller cover 111, transferring of the heat from the controller cover 111, to the memory cover 112 is suppressed. For this reason, even though the temperature of the controller cover 111 is higher than the temperature of the memory cover 112, the heat of the controller cover 111 is not extensively transferred to the memory cover 112.

The second projecting portion 132c of the memory cover 112 is in contact with the electronic component 104 at the position which overlaps the first and second board connectors 101 and 102 in the direction along the Y axis. For this reason, heat of the second circuit board 72 is transferred to the second projecting portion 132c of the memory cover 112 through the first and second board connectors 101 and 102, the first circuit board 71, and the electronic component 104. Accordingly, the second circuit board 72 is cooled.

In the data center 1 according to the first embodiment, the flash memory 43 overlaps the first conductive layer 82 in the plane direction of the first circuit board 71. The first conductive layer 82 is thermally connected to the first conductive pattern 83 through the first via 87, and the first conductive pattern 83 is thermally connected to the top cover 52 through the first thermal conductive sheet 88. Thus, heat generated from the flash memory 43 is transferred to the top cover 52 through the first conductive layer 82, the first via 87, the first conductive pattern 83, and the first thermal conductive sheet 88. Accordingly, heat of the flash memory 43 is dissipated through the top cover 52, and the temperature in the case 41 is suppressed from increasing.

The first conductive pattern 83 is formed at the end portion of the first surface 71a. Components and wiring of the first circuit board 71 may be much provided at a position which is apart from the end portion of the first circuit board 71, not at the end portion of the first circuit board 71. For this reason, limit of disposition of components and wiring of the first circuit board 71 due to providing of the first conductive pattern 83 at the end portion of the first surface 71a is suppressed. The components of the first circuit board 71 include the flash memory 43 and the controller 44.

The top cover 52 is connected to the end portion of the first covering portion 131a which covers the first surface 71a, and includes the extension portion 131f which extends in the direction along the first surface 71a. The extension portion 131f is thermally connected to the first conductive pattern 83 through the first thermal conductive sheet 88. Thus, a larger contact surface area between the top cover 52, the first thermal conductive sheet 88, and the first conductive pattern than before is easily ensured. Heat is efficiently transferred from the first conductive pattern 83 to the top cover 52.

The plurality of first via 87 connects the first conductive layer 82 and the first conductive pattern 83. That is, a plurality of heat transfer paths is provided between the first conductive layer 82 and the first conductive pattern 83, and thus heat generated from the flash memory 43 is efficiently transferred to the top cover 52. Accordingly, heat of the flash memory 43 is dissipated through the top cover 52 and the temperature in the case 41 is suppressed from increasing.

At least a portion of the controller cover 111 of the top cover 52 which is thermally connected to the controller 44 having the greater amount of generated heat, forms the space (gap) G between at least a portion of the controller cover 111 and the memory cover 112 which is thermally connected to the flash memory 43. For this reason, heat transfer from the controller cover 111 to the flash memory 43 through the memory cover 112 is suppressed.

The controller cover 111 includes the fin 127 which is provided on the outer surface 111b. Thus, heat which is transferred to the controller cover 111 from the controller 44 is easily dissipated into the open air in the module case 21. Heat transfer of the controller cover 111 to the flash memory 43 through the memory cover 112 is suppressed.

The fin 127 extends in a direction along an air flow generated by the fan 25. Thus, heat which is transferred to the controller cover 111 from the controller 44 is dissipated with improved efficiency. Heat transfer from the controller cover 111 to the flash memory 43 through the memory cover 112 is suppressed.

The memory cover 112 is attached to the controller cover 111. Thus, integral handling of the memory cover 112 and the controller cover 111 is enabled, for example, when the SSD 26 is assembled, and assembling of the SSD 26 becomes easy.

The controller cover 111 to which heat is transferred from the controller 44 having a greater amount of generated heat is closer to the external connector 47 than to the memory cover 112. For this reason, heat of the controller cover 111 to the module board 22 or the module case 21 through the external connector 47 is easily transferred. Thus, heat transfer from the controller cover 111 to the flash memory 43 through the memory cover 112 is suppressed.

The controller cover 111 overlaps the external connector 47 in a plane direction of the circuit board 42. For this reason, heat is more efficiently transferred from the controller cover 111 to the module board 22 or the module case 21 through the external connector 47. Thus, heat transfer from the controller cover 111 to the flash memory 43 through the memory cover 112 is further suppressed.

The protrusion portion 123 of the top cover 52 passes through the opening portion 106 of the first circuit board 71. The protrusion portion 123 is thermally connected to the controller 44 which has an amount of generated heat greater than that of the flash memory 43, through the fourth thermal conductive sheet 125. Heat generated from the controller 44 is transferred to the top cover 52 through the fourth thermal conductive sheet 125. Thus, heat of the controller 44 is dissipated through the top cover 52. The controller 44 is allowed to be provided on the third surface 72a of the second circuit board 72. Degradation of the degree of the freedom in disposition of the flash memory 43 and the controller 44 in the SSD 26 is suppressed. Also, the thickness of the SSD 26 can be decreased.

The controller 44 has a length longer than the length of the flash memory 43 in the direction in which the third surface 72a of the second circuit board 72 is directed. The opening portion 106 is provided at the position which overlaps such a controller 44. For this reason, the first circuit board 71 does not contact the controller 44, and a distance between the first circuit board 71 and the second circuit board 72 is freely set.

The controller 44 is surrounded by the edge of the first circuit board 71, which forms the opening portion 106, in a plan view from the direction in which the third surface 72a is directed. For this reason, the first circuit board 71 does not contact the controller 44, and a distance between the first circuit board 71 and the second circuit board 72 can be freely set.

At least one of the flash memories 43 is thermally connected to the bottom cover 53 through the sixth thermal conductive sheet 141. Heat generated from the flash memory 43 is transferred to the bottom cover 53. Thus, heat of the flash memory 43 is dissipated through the bottom cover 53.

The fifth thermal conductive sheet 135 thermally connects the flash memory 43 and the case 41. Thus, heat of the flash memory 43 is also dissipated through the case 41.

The first and second circuit boards 71 and 72 are attached to the frame 51, and the top cover 52 is also attached to the frame 51. Thus, when external force is applied to the top cover 52, deformation of the first and second circuit boards 71 and 72 is suppressed.

Some of the plurality of flash memories 43 which is provided on the first circuit board 71 are adjacent to the controller 44 in a plan view from the thickness direction of the first circuit board 71. However, since the first circuit board 71 is apart from the second circuit board 72 in the thickness direction (direction along the Z axis) of the first circuit board 71, increasing of the temperature of the flash memory 43 which is provided on the first circuit board 71, is less like to increase due to heat generated by the controller 44.

The first and second board connectors 101 and 102 are disposed between the controller 44 and the flash memory 43 on the third surface 72a of the second circuit board 72. In other words, the first and second board connectors 101 and 102 divide a region into an area in which the controller 44 is provided, and an area in which the flash memory 43 is provided. For this reason, the controller 44 is less likely to heat the flash memory 43 through the air in the case 41.

The controller 44 is closer to the external connector 47 than to the flash memory 43. The controller cover 111 is closer to the external connector 47 than to the memory cover 112. That is, a portion at which the temperature easily increases is arranged at a position closer to the external connector 47. Accordingly, heat is less likely to be transferred to the flash memory 43, because heat generated from, for example, the controller 44 is transferred to the module case 21 through the external connector 47.

The plurality of capacitors 46 extends in a direction (direction along the Y axis) in which the first circuit board 71 extends. Thus, the SSD 26 can have a thinner thickness (length in the direction along the Z axis).

A plurality of pads 75 on which the flash memory 43 is not provided is exposed in the second surface 71b of the first circuit board 71. In this manner, if a surface on which the flash memory 43 is not provided and the exposed pad 75 is provided is set among the first to fourth surfaces 71a, 71b, 72a, and 72b of the first and second circuit boards 71 and 72, the second surface 71b may be firstly selected. If the surface on which the exposed pad 75 is provided is set, the third surface 72a may be secondly selected. Since the first and fourth surfaces 71a and 72b face the outside of the SSD 26, the first and fourth surfaces 71a and 72b are easily thermally connected to the case 41 through the fifth and sixth thermal conductive sheets 135 and 141, for example. For this reason, the flash memory 43 provided on the first and fourth surfaces 71a and 72b may be cooled more efficiently than the flash memory 43 provided on the second and the third surfaces 71b and 72a.

In the first embodiment, the fin 127 is provided on the outer surface 111b of the controller cover 111. However, a provision position of the fin 127 is not limited thereto. The fin 127 may be provided on at least one of the outer surface 111b of the controller cover 111 and the outer surface 131h of the covering member 131 of the memory cover 112.

Figure 7:
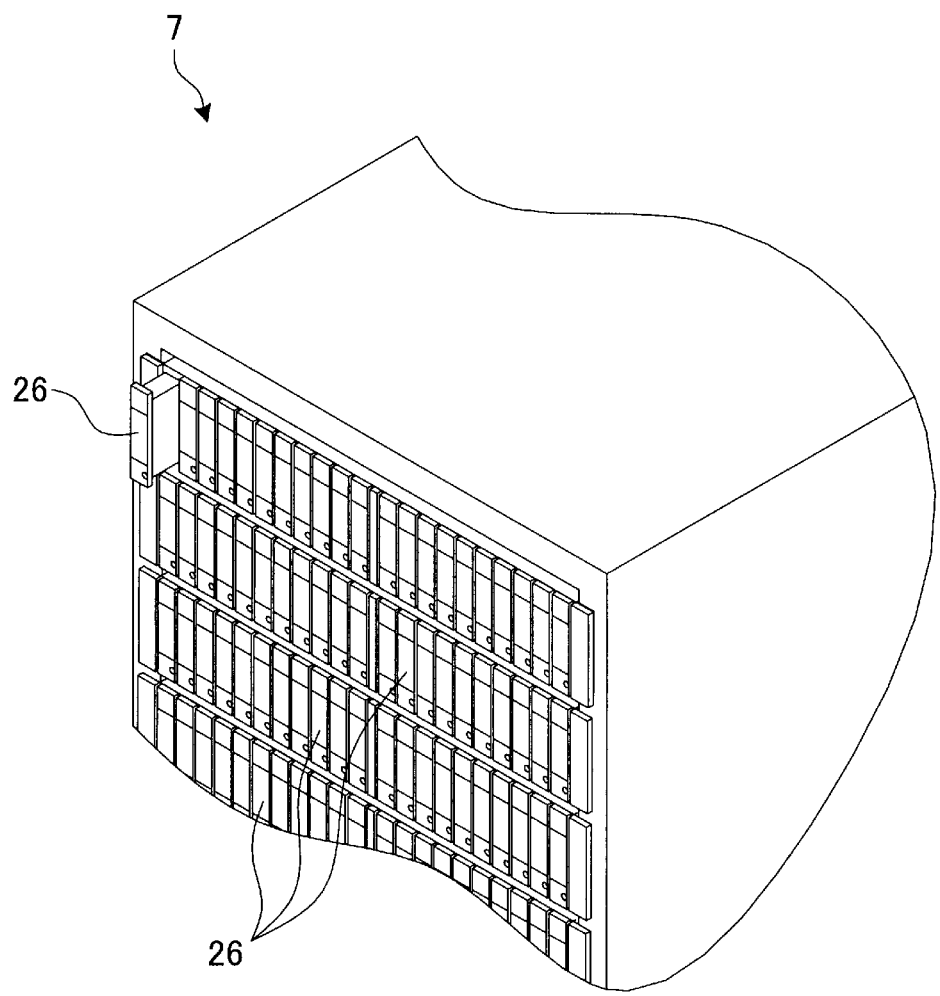
FIG. 7 is a perspective view of disk array storage as a modification example of the first embodiment.

FIG. 7 is a perspective view of a disk array storage 7 as a modification example of the first embodiment. In the first embodiment, the SSD 26 is provided in the server module 5 of the data center 1. However, the SSD 26 may be provided in other systems and other devices like the disk array storage 7.

A plurality of SSDs 26 is inserted into the disk array storage 7. The disk array storage 7 is used as an integral storage system or an integral storage device which includes the plurality of SSDs 26. That is, the disk array storage 7 is a storage system having a plurality of flash memories 43 which is respectively provided in the plurality of SSDs 26.

A second embodiment will be described below with reference to FIG. 8. In the following multiple embodiments, components having functions similar to those of already-described components are denoted by the same reference numerals, and description thereof may be omitted. All of a plurality of components which are denoted by the same reference numerals is not limited to having common functions and properties, and may have different functions and properties in accordance with embodiments.

Figure 8:
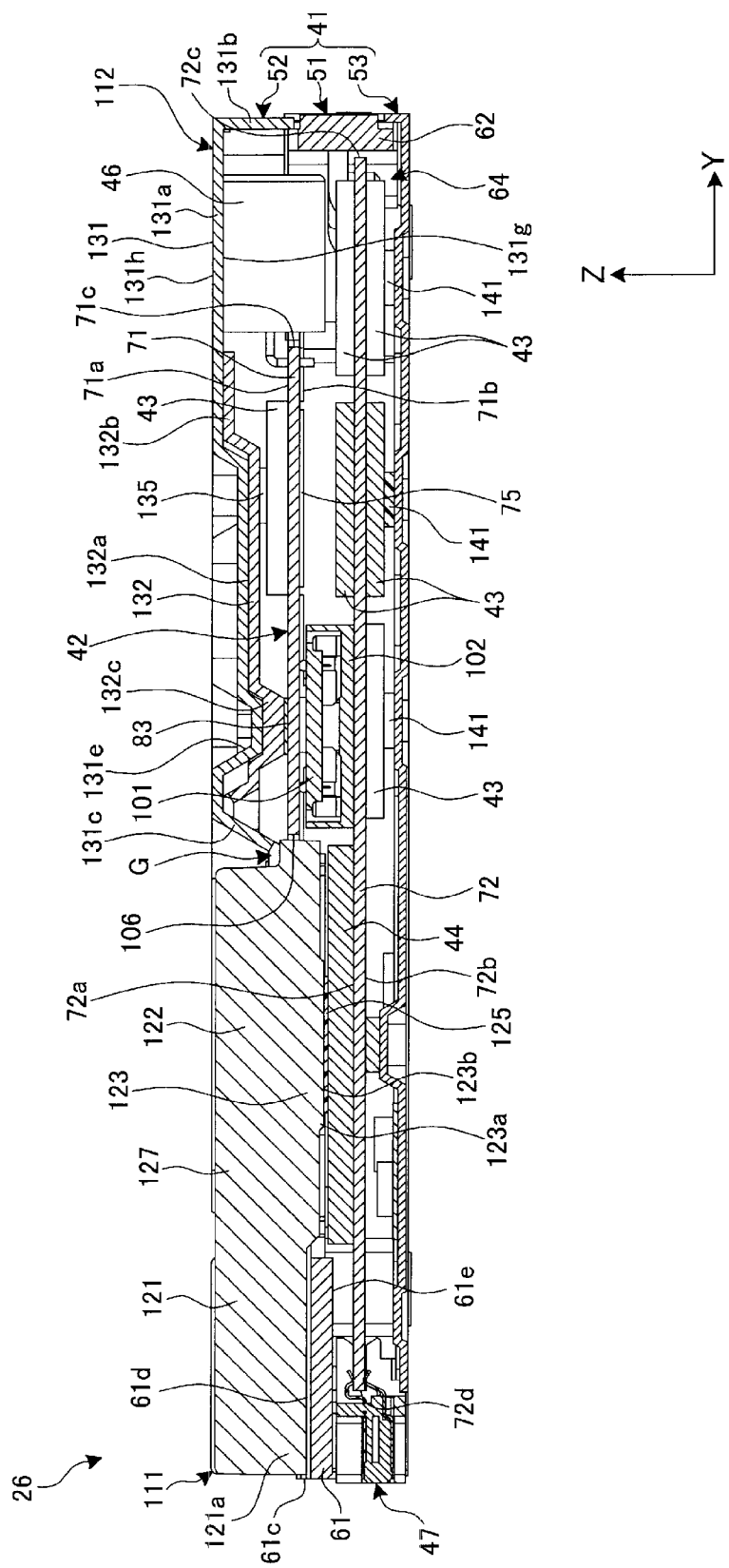
FIG. 8 is a cross-sectional view of an SSD according to a second embodiment.

FIG. 8 is a cross-sectional view of an SSD 26 according to the second embodiment. As illustrated in FIG. 8, the first conductive pattern 83 of the first circuit board 71 is formed at the substantially center portion of the first surface 71a in the second embodiment. The first conductive pattern 83 is arranged at a position which overlaps the first board connector 101 in the plane direction (direction along Y axis) of the first circuit board 71.

The second projecting portion 132c of the protruding member 132 of the memory cover 112 is in contact with the first conductive pattern 83 which is formed at the substantially center portion of the first surface 71a, through an insulating thermal conductive sheet, for example. In other words, the second projecting portion 132c is thermally connected to the position of the first surface 71a, which overlaps the first board connector 101 in the direction in which the first surface 71a extends (direction along the Y axis).

In the SSD 26 according to the second embodiment, the first conductive pattern 83 is formed at the position overlapping the first board connector 101 which connects the first circuit board 71 to the second circuit board 72 in the plane direction of the first circuit board 71. Thus, heat of the second circuit board 72 is transferred to the first circuit board 71 through the first and second board connectors 101 and 102. Heat transferred to the first circuit board 71 is further transferred to the top cover 52 from the first conductive layer 82 through the first conductive pattern 83. Thus, heat of the second circuit board 72 is dissipated through the top cover 52, and the temperature in the case 41 is suppressed from increasing.

The second projecting portion 132c of the case 41 is thermally connected to the position of the first surface 71a, which overlaps the first board connector 101 in the direction in which the first surface 71a extends. Thus, heat generated from the controller 44 is transferred to the second projecting portion 132c through the second circuit board 72, the second board connector 102, the first board connector 101, and the first circuit board 71. In this manner, heat of the controller 44 is dissipated through the first and second board connectors 101 and 102 by the case 41.

The first circuit board 71 and the first board connector 101 are held between the second projecting portion 132c and the second board connector 102. Thus, bending of the first circuit board 71 at a position at which the first board connector 101 is arranged is suppressed.

The first board connector 101 is arranged at the substantially center portion of the first circuit board 71 in the direction in which the first circuit board 71 extends. The first board connector 101 and the first circuit board 71 are held between the second projecting portion 132c and the second board connector 102. That is, the substantially center portion of the first circuit board 71 is held. Accordingly, bending of the first circuit board 71 is further suppressed. Large variation in a distance for wiring between the plurality of flash memories 43 which is provided on the first and second circuit boards 71 and 72, and the controller 44 which is provided on the second circuit board 72 is suppressed.

At least one of the flash memories 43 is provided at a position of the fourth surface 72b of the second circuit board 72, which overlaps the second board connector 102 in the direction in which the fourth surface 72b extends. Thus, heat generated from the flash memory 43 is transferred to the second projecting portion 132c through the second circuit board 72, the second board connector 102, the first board connector 101, and the first circuit board 71. In this manner, heat of the flash memory 43 is dissipated to the case 41 through the first and second board connectors 101 and 102.

Figure 9:
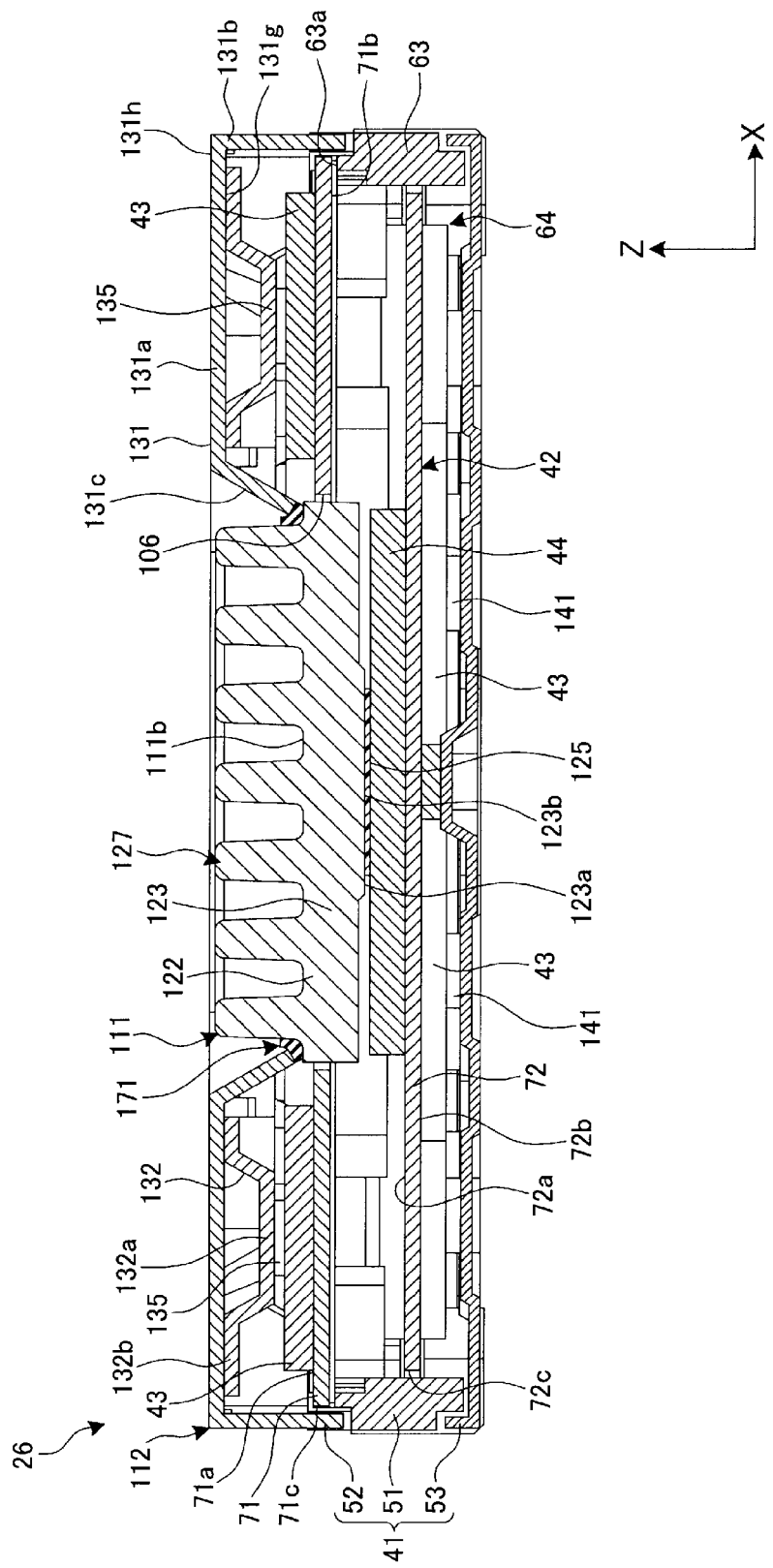
FIG. 9 is a cross-sectional view of an SSD according to a third embodiment.

A third embodiment will be described below with reference to FIG. 9. FIG. 9 is a cross-sectional view of an SSD 26 according to the third embodiment. As illustrated in FIG. 9, a top cover 52 according to the third embodiment includes the controller cover 111, the memory cover 112, and a heat insulator 171. The heat insulator 171 is an example of the third portion, and may be also referred to as an interposition portion, an intermediate portion, a blocking portion, a seal portion, or a seal member.

The heat insulator 171 is formed of synthetic resin, for example. The material of the heat insulator 171 is not limited thereto, and the heat insulator 171 may be formed of other materials such as ceramics. Thermal conductivity of the heat insulator 171 is lower than thermal conductivity of the controller cover 111. Thermal conductivity of the heat insulator 171 is lower than thermal conductivity of the memory cover 112.

The heat insulator 171 is disposed between the controller cover 111 and the memory cover 112. For example, the heat insulator 171 is disposed between the outer surface 111b of the controller cover 111 and the second edge portion 131c of the memory cover 112, and closes the space (gap) G between the controller cover 111 and the memory cover 112. The heat insulator 171 may be bonded to the controller cover 111 and the memory cover 112 using heat-insulating adhesive. Alternatively, the heat insulator 171 may be fixed to the controller cover 111 and the memory cover 112 using the screw 113.

In the SSD 26 according to the third embodiment, the heat insulator 171, which has thermal conductivity lower than the memory cover 112 and the controller cover 111, is disposed between the memory cover 112 and the controller cover 111. Thus, heat transfer from the controller cover 111 to the flash memory 43 through the memory cover 112 is further suppressed.

Figure 10:
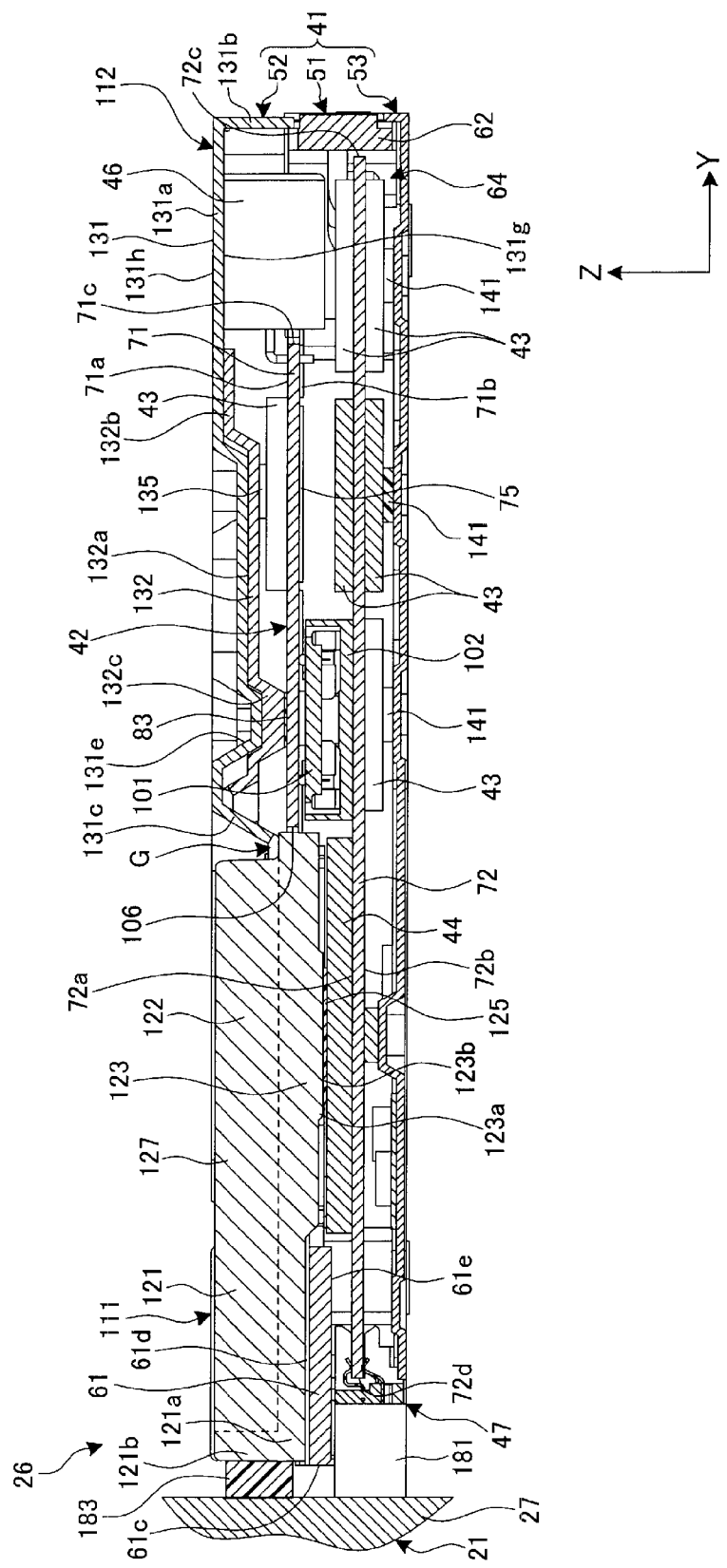
FIG. 10 is a cross-sectional view of an SSD according to a fourth embodiment.

A fourth embodiment will be described below with reference to FIG. 10. FIG. 10 is a cross-sectional view of an SSD 26 according to the fourth embodiment. As illustrated in FIG. 10, the first heat dissipative portion 121 of the controller cover 111 in the fourth embodiment includes a thermal connection portion 121b.

The thermal connection portion 121b is provided at one end portion of the first heat dissipative portion 121 in the direction along the Y axis. The end portion of the first heat dissipative portion 121 at which the thermal connection portion 121b is provided is directed in a direction same as a direction in which the external connector 47 is directed. Disposition of the thermal connection portion 121b is not limited thereto.

The external connector 47 of the SSD 26, is connected to the module connector 181, which is provided on the front panel 27 of the module case 21, for example. The SSD 26 which is connected to the module connector 181 is supported by the module connector 181 and a support portion which is provided in the module case 21, for example.

The thermal connection portion 121b of the first heat dissipative portion 121 extends along the front panel 27. A seventh thermal conductive sheet 183 is disposed between the thermal connection portion 121b and the front panel 27. The seventh thermal conductive sheet 183 may be also referred to as a heat transfer member, for example. The seventh thermal conductive sheet 183 thermally connects the thermal connection portion 121b of the controller cover 111 and the front panel 27 of the module case 21. The seventh thermal conductive sheet 183 has elasticity which is larger than that of the controller cover 111 and is larger than that of the front panel 27. The seventh thermal conductive sheet 183 is elastically pressed between the controller cover 111 and the front panel 27 so as to adhere to the controller cover 111 and the front panel 27.

In a data center 1 according to the fourth embodiment, the controller cover 111 of the case 41 of the SSD 26 is thermally connected to the module case 21 of the data center 1. Thus, the controller cover 111 that receives heat from the controller 44 is efficiently cooled by an open air of the server module 5 through the module case 21. Heat transfer of the controller cover 111 to the flash memory 43 through the memory cover 112 is suppressed.

According to at least one embodiment described above, a housing includes a first portion that is thermally connected to the first electronic component, and a second portion that is thermally connected to a second electronic component, is thermally separated from the first portion, and includes at least a portion of the second portion forming an interval with the first portion. Accordingly, heat transfer from the second electronic component to the first electronic component may be suppressed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a semiconductor memory unit;
a memory controller;
a cover unit having a first portion covering the semiconductor memory unit and a second portion covering the memory controller;
a first heat conduction member disposed between the semiconductor memory unit and the first portion of the cover unit; and
a second heat conduction member disposed between the memory controller and the second portion of the cover unit, wherein
the cover unit has a gap formed between the first and second portions.

2. The semiconductor memory device according to claim 1, wherein
a portion of the gap extends linearly and is aligned with an edge of the memory controller.

3. The semiconductor memory device according to claim 1, further comprising:
a first substrate having a surface that faces the first portion of the cover unit and on which the semiconductor memory unit is disposed; and
a second substrate having a surface that faces the second portion of the cover unit and on which the memory controller is disposed, the first substrate being disposed between the second substrate and the first portion of the cover unit, wherein
the second portion of the cover unit extends through an opening formed in the first substrate.

4. The semiconductor memory device according to claim 3, wherein
the first substrate includes a connector electrically connected to the second substrate, and
the first portion of the cover unit covers a portion of the first substrate corresponding to the connector.

5. The semiconductor memory device according to claim 3, wherein
the second portion of the cover unit extends through the opening in a thickness direction of the first substrate.

6. The semiconductor memory device according to claim 1, wherein
at least one of the first and second portions of the cover unit has a plurality of fins extending outward.

7. The semiconductor memory device according to claim 1, wherein
the first portion of the cover unit does not cover any portion of the memory controller, and
the second portion of the cover unit does not cover any portion of the semiconductor memory unit.

8. The semiconductor memory device according to claim 1, wherein
the first portion of the cover unit has an opening at a location corresponding to that of the opening formed in the first substrate, and
the second portion of the cover unit protrudes through the opening in the first portion of the cover unit.

9. The semiconductor memory device according to claim 1, wherein
the first heat conduction member is in direct contact with the first portion of the cover unit and the semiconductor memory unit, and
the second heat conduction member is in direct contact with the second portion of the cover unit and the memory controller.

10. A server, comprising:
a main body including a plurality of slots; and
a plurality of server modules, each being fit in one of the slots, wherein
at least one of the server modules includes a semiconductor memory device including:
a semiconductor memory unit;
a memory controller;
a cover unit having a first portion covering the semiconductor memory unit and a second portion covering the memory controller;
a first heat conduction member disposed between the semiconductor memory unit and the first portion of the cover unit; and
a second heat conduction member disposed between the memory controller and the second portion of the cover unit, and wherein
the cover unit has a gap formed between the first and second portions.

11. The server according to claim 10, wherein
a portion of the gap extends linearly and is aligned with an edge of the memory controller.

12. The server according to claim 10, wherein
the second portion of the cover unit has a plurality of fins extending outward.

13. The server according to claim 12, wherein
said one of the server modules further includes a fan, and
the fins also extend along a direction of an air flow generated by the fan.

14. The server according to claim 10, wherein
said one of the server modules further includes a container in which the semiconductor memory device is contained and a third heat conduction member disposed between the container and the second portion of the cover unit.

15. The server according to claim 14, wherein the third heat conduction member is formed of an elastic material and pressed between the container and the second portion of the cover unit.

16. A semiconductor memory device, comprising:
a semiconductor memory unit;
a memory controller;
a cover unit having a first portion covering the semiconductor memory unit and a second portion covering the memory controller;
a first heat conduction member disposed between the semiconductor memory unit and the first portion of the cover unit;
a second heat conduction member disposed between the memory controller and the second portion of the cover unit; and
a heat insulating member disposed between a gap formed between the first and second portions.

17. The semiconductor memory device according to claim 16, wherein
a portion of the gap extends linearly and is aligned with an edge of the memory controller.

18. The semiconductor memory device according to claim 16, wherein
a first substrate having a surface that faces the first portion of the cover unit and on which the semiconductor memory unit is disposed; and
a second substrate having a surface that faces the second portion of the cover unit and on which the memory controller is disposed, the first substrate being disposed between the second substrate and the first portion of the cover unit, wherein
the second portion of the cover unit extends through an opening formed in the first substrate.

19. The semiconductor memory device according to claim 16, wherein
the first portion of the cover unit does not cover any portion of the memory controller, and
the second portion of the cover unit does not cover any portion of the semiconductor memory unit.

20. The semiconductor memory device according to claim 16, wherein
the first heat conduction member is in direct contact with the first portion of the cover unit and the semiconductor memory unit, and
the second heat conduction member is in direct contact with the second portion of the cover unit and the memory controller.

* * * * *